(12) United States Patent
Matsuura et al.

(10) Patent No.: US 10,998,328 B2
(45) Date of Patent: May 4, 2021

(54) SEMICONDUCTOR MEMORY DEVICE

(71) Applicant: Toshiba Memory Corporation, Minato-ku (JP)

(72) Inventors: Osamu Matsuura, Kuwana (JP); Satoshi Tatara, Kuwana (JP)

(73) Assignee: Toshiba Memory Corporation, Minato-ku (JP)

( * ) Notice: Subject to any disclaimer, the term of this patent is extended or adjusted under 35 U.S.C. 154(b) by 151 days.

(21) Appl. No.: 15/917,160

(22) Filed: Mar. 9, 2018

(65) Prior Publication Data
US 2018/0261608 A1  Sep. 13, 2018

Related U.S. Application Data

(60) Provisional application No. 62/469,636, filed on Mar. 10, 2017.

(51) Int. Cl.
| | |
|---|---|
| *H01L 27/115* | (2017.01) |
| *H01L 27/1157* | (2017.01) |
| *H01L 27/11582* | (2017.01) |
| *H01L 27/11565* | (2017.01) |
| *H01L 27/11575* | (2017.01) |

(52) U.S. Cl.
CPC .... *H01L 27/1157* (2013.01); *H01L 27/11565* (2013.01); *H01L 27/11575* (2013.01); *H01L 27/11582* (2013.01)

(58) Field of Classification Search
CPC ......... H01L 27/11582; H01L 27/11575; H01L 27/1157; H01L 27/11565; H01L 27/11573
See application file for complete search history.

(56) References Cited

U.S. PATENT DOCUMENTS

| | | | |
|---|---|---|---|
| 7,847,334 B2 | 12/2010 | Katsumata et al. | |
| 8,247,860 B2 | 8/2012 | Iwase et al. | |
| 8,435,857 B2 | 5/2013 | Kiyotoshi | |
| 2013/0062683 A1 | 3/2013 | Fukuzumi et al. | |
| 2015/0001460 A1 | 1/2015 | Kim et al. | |
| 2015/0109862 A1 | 4/2015 | Shibata et al. | |

FOREIGN PATENT DOCUMENTS

| | | |
|---|---|---|
| JP | 4691124 | 6/2011 |
| JP | 2012-151187 | 8/2012 |
| JP | 2013-58683 | 3/2013 |
| JP | 5306080 | 10/2013 |
| JP | 2015-12296 | 1/2015 |
| JP | 2015-79862 | 4/2015 |

*Primary Examiner* — Tony Tran
(74) *Attorney, Agent, or Firm* — Oblon, McClelland, Maier & Neustadt, L.L.P.

(57) ABSTRACT

A semiconductor memory device includes a stacked body, a semiconductor member, and a first insulating member. Electrode films and insulating films are alternately stacked along a first direction in the stacked body. An end part of the stacked body is shaped like a staircase in which a terrace is formed for each of the electrode films. A portion of the electrode film placed in the end part is thicker than a portion of the electrode film placed in a central part of the stacked body. The semiconductor member extends in the first direction and penetrates through the central part of the stacked body. The first insulating member extends in the first direction and is provided in the end part.

12 Claims, 22 Drawing Sheets

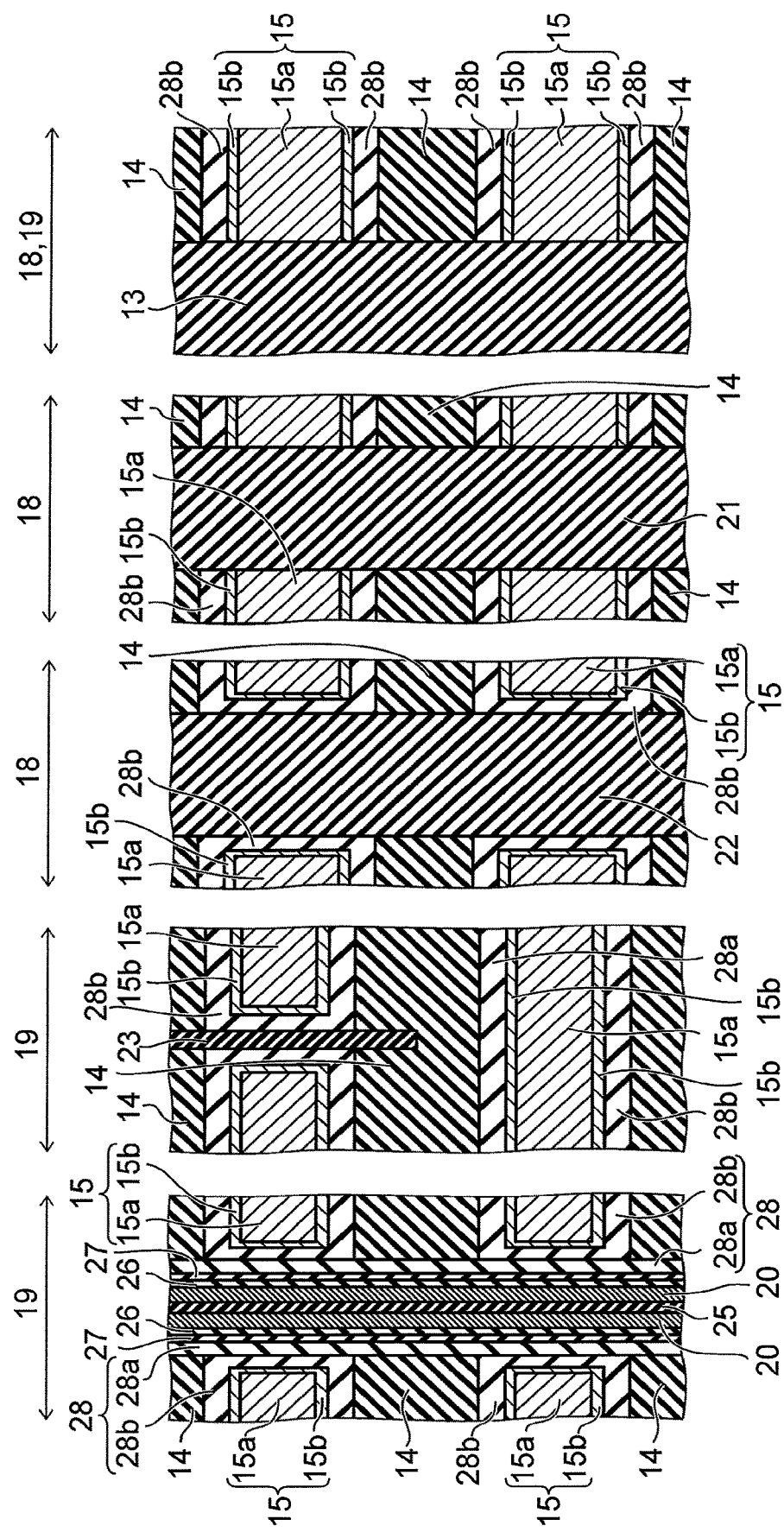

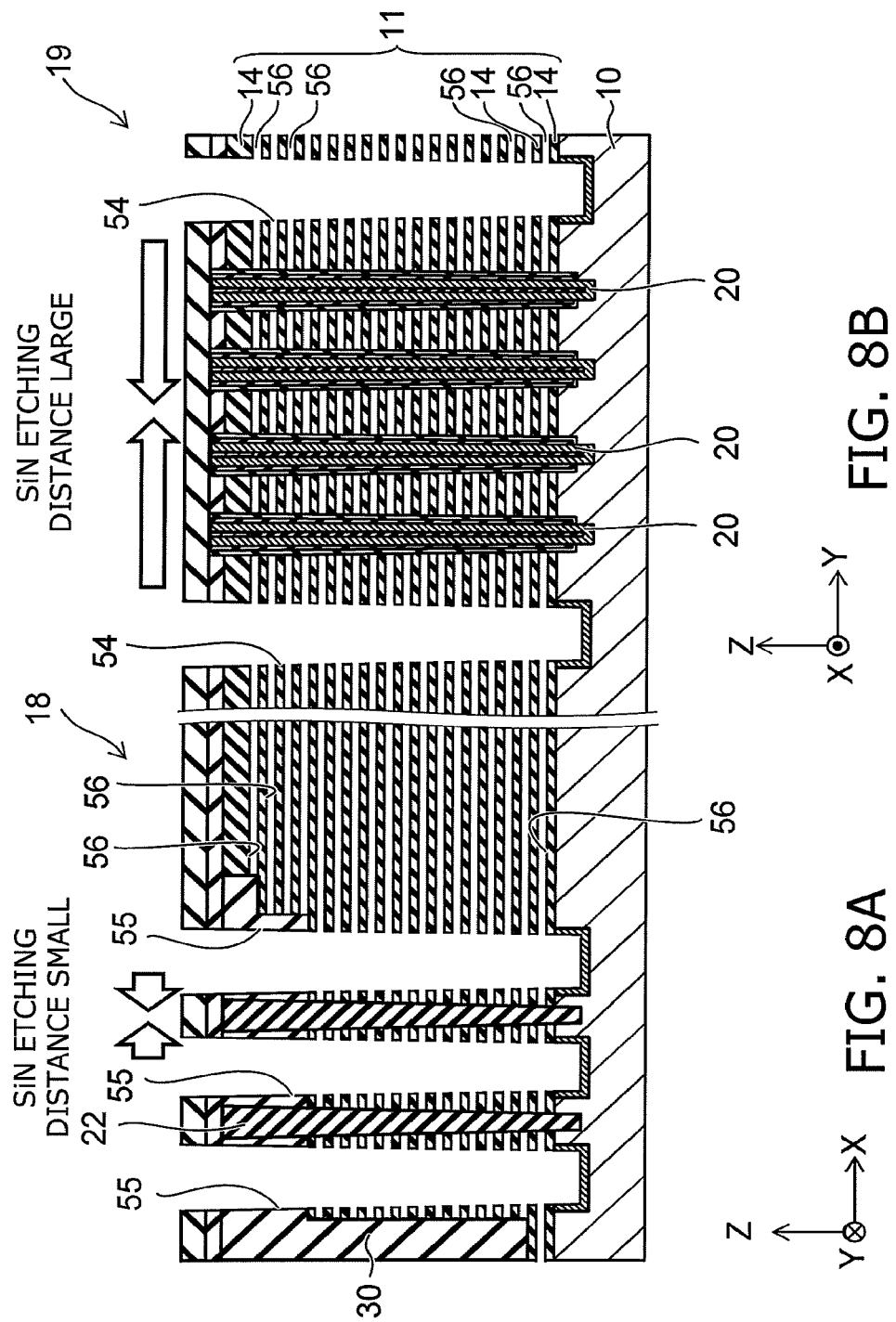

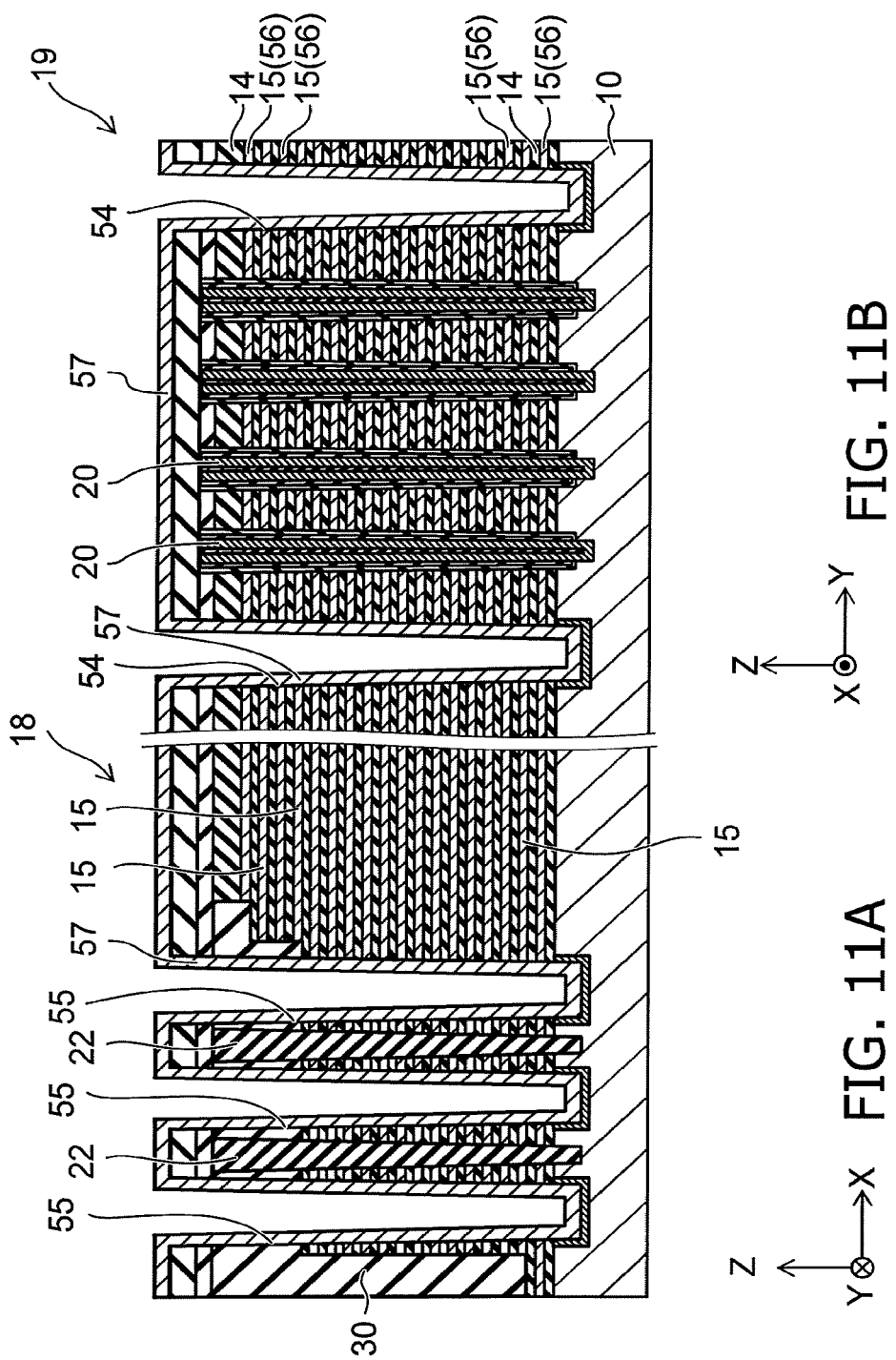

SEMICONDUCTOR MEMORY DEVICE

CROSS-REFERENCE TO RELATED APPLICATIONS

This application is based upon and claims the benefit of priority from U.S. Provisional Patent Application 62/469,636, filed on Mar. 10, 2017; the entire contents of which are incorporated herein by reference.

FIELD

Embodiments relate to a semiconductor memory device.

BACKGROUND

In recent years, there has been proposed a stacked type semiconductor memory device in which memory cells are integrated three-dimensionally. Such a stacked type semiconductor memory device is provided with a stacked body on a semiconductor substrate. The stacked body includes electrode films and insulating films alternately stacked therein. Semiconductor pillars are provided through the stacked body. A memory cell is formed for each intersecting portion of the electrode film and the semiconductor pillar. The end part of the stacked body is processed in a staircase shape. An interlayer insulating film is provided on the end part. A plurality of contact holes reaching the respective electrode films are collectively formed in the interlayer insulating film to form contacts connected to the respective electrode films. However, in such a stacked type semiconductor memory device, increasing the number of stacked layers for improving the degree of integration of memory cells makes it difficult to achieve compatibility between the performance of individual memory cells and the ease of manufacturing.

BRIEF DESCRIPTION OF THE DRAWINGS

FIG. 4A is a sectional view showing the silicon pillar 20 and its surroundings in the semiconductor memory device according to the first embodiment, FIG. 4B is a sectional view showing the insulating member 23 and its surroundings, FIG. 4C is a sectional view showing the strut 22 and its surroundings, FIG. 4D is a sectional view showing the insulating member 21 and its surroundings, and FIG. 4E is a sectional view showing the insulating plate 13 and its surroundings;

FIGS. 5A to 8B are sectional views showing a method for manufacturing the semiconductor memory device according to the first embodiment;

FIGS. 11A to 17 are sectional views showing the method for manufacturing the semiconductor memory device according to the first embodiment;

DETAILED DESCRIPTION

A semiconductor memory device according to one embodiment includes a stacked body, a semiconductor member, and a first insulating member. Electrode films and insulating films are alternately stacked along a first direction in the stacked body. An end part of the stacked body in a second direction is shaped like a staircase in which a terrace is formed for each of the electrode films. The second direction crosses the first direction. A portion of the electrode film placed in the end part is thicker than a portion of the electrode film placed in a central part in the second direction of the stacked body. The semiconductor member extends in the first direction and penetrates through the central part of the stacked body. The first insulating member extends in the first direction and is provided in the end part. The electrode film includes a conductive body part and a conductive layer covering part of a surface of the body part. The conductive layer is placed between the body part and the semiconductor member, and not placed between the body part and the first insulating member.

A semiconductor memory device according to one embodiment includes a stacked body, a semiconductor member, a charge storage member, first conductive plates, a first insulating plate, and a second insulating plate. Electrode films and insulating films are alternately stacked along a first direction in the stacked body. The semiconductor member extends in the first direction and penetrates through the stacked body. The charge storage member is provided between the semiconductor member and the electrode film. The first conductive plates extend in a second direction and are provided on both third direction sides of the stacked body. The second direction crosses the first direction. The third direction crosses a plane including the first direction and the second direction. The first insulating plate is provided between the first conductive plate and the stacked body. The second insulating plate is provided in the stacked body and partly divides the electrode films in the second direction.

First Embodiment

Embodiments of the invention will now be described with reference to the drawings.

First, a first embodiment is described.

Figure 1:
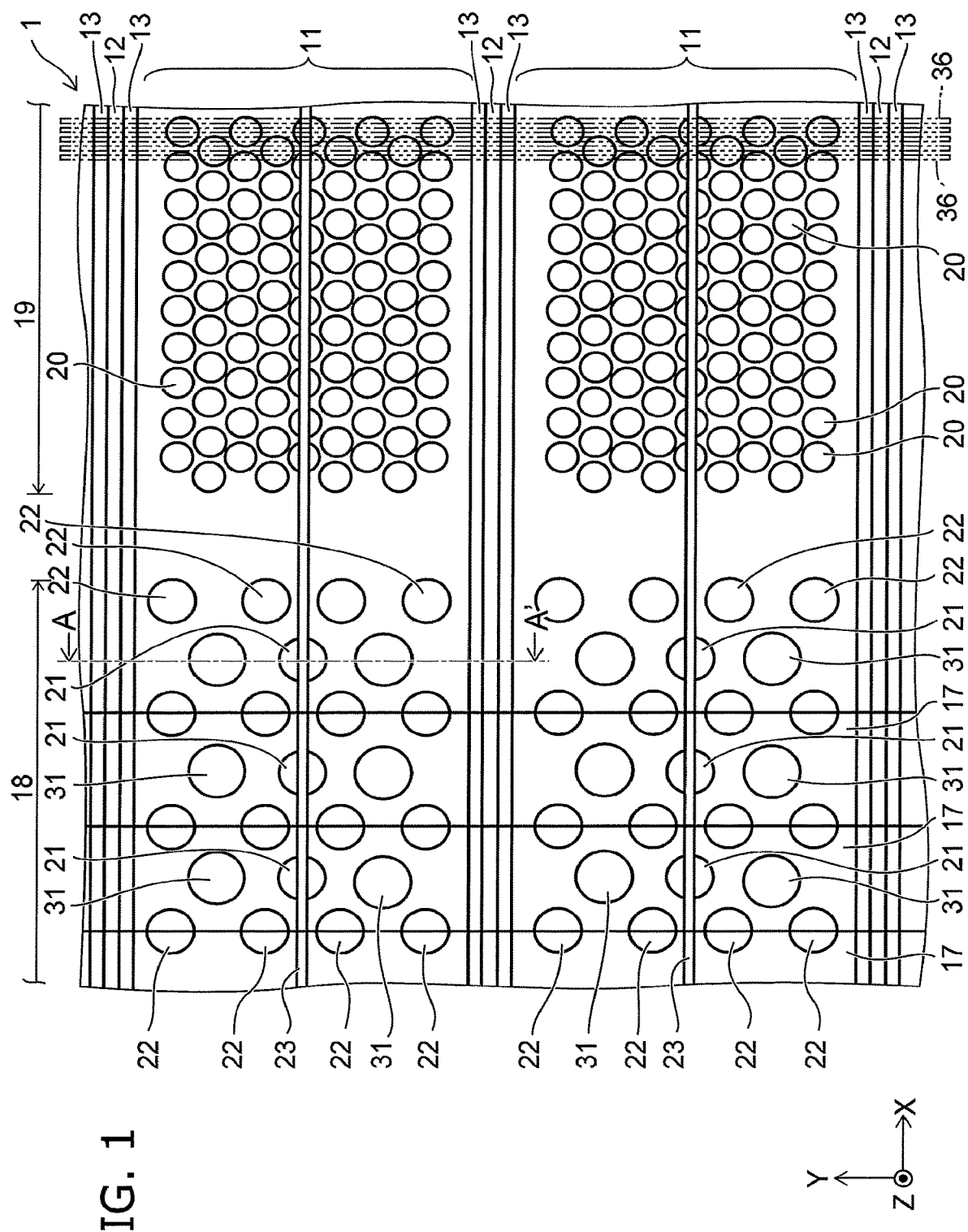
FIG. 1 is a plan view showing a semiconductor memory device according to a first embodiment.

FIG. 1 is a plan view showing a semiconductor memory device according to the embodiment.

Figure 2:
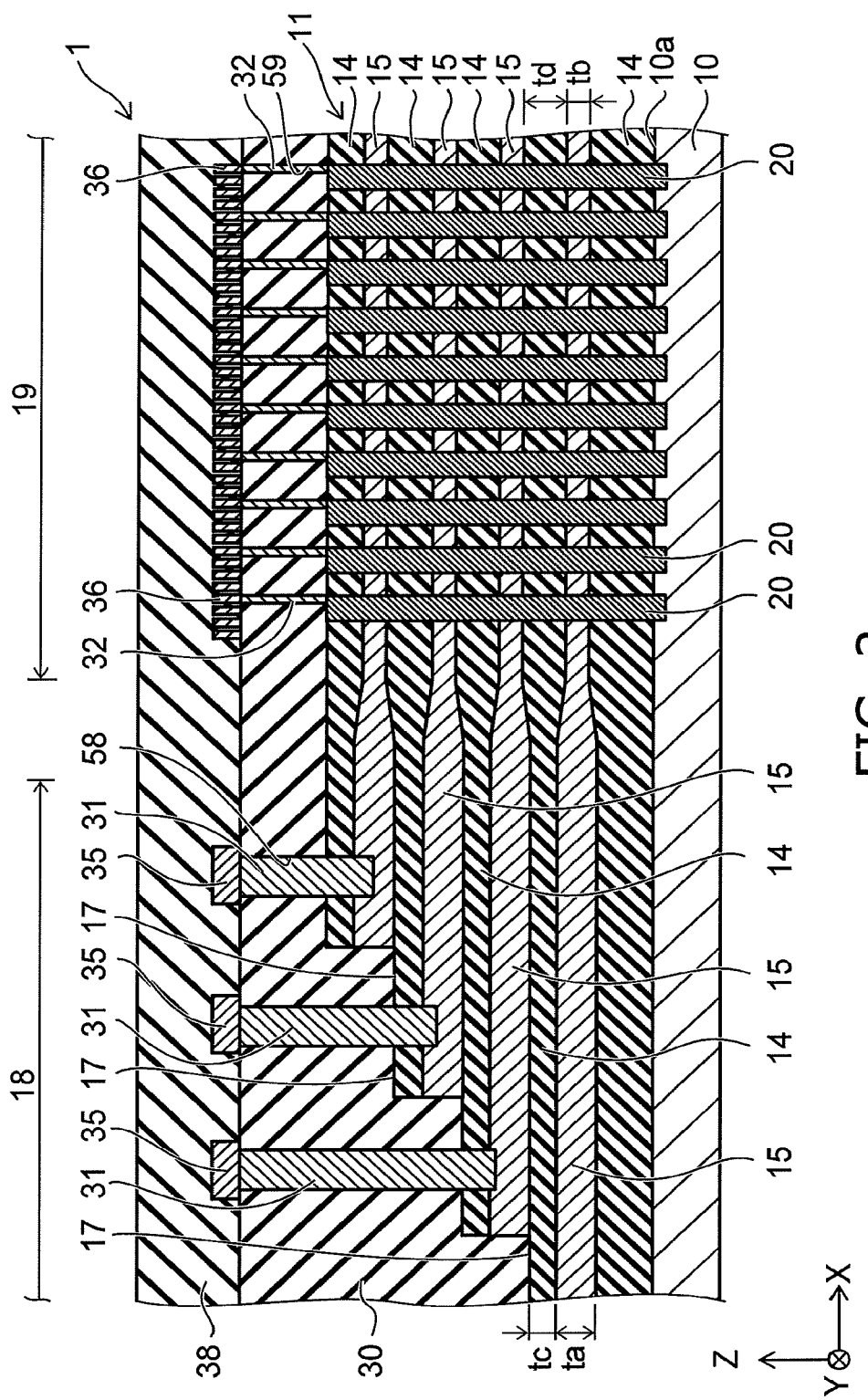
FIGS. 2 and 3 are sectional views showing the semiconductor memory device according to the first embodiment.
Figure 3:
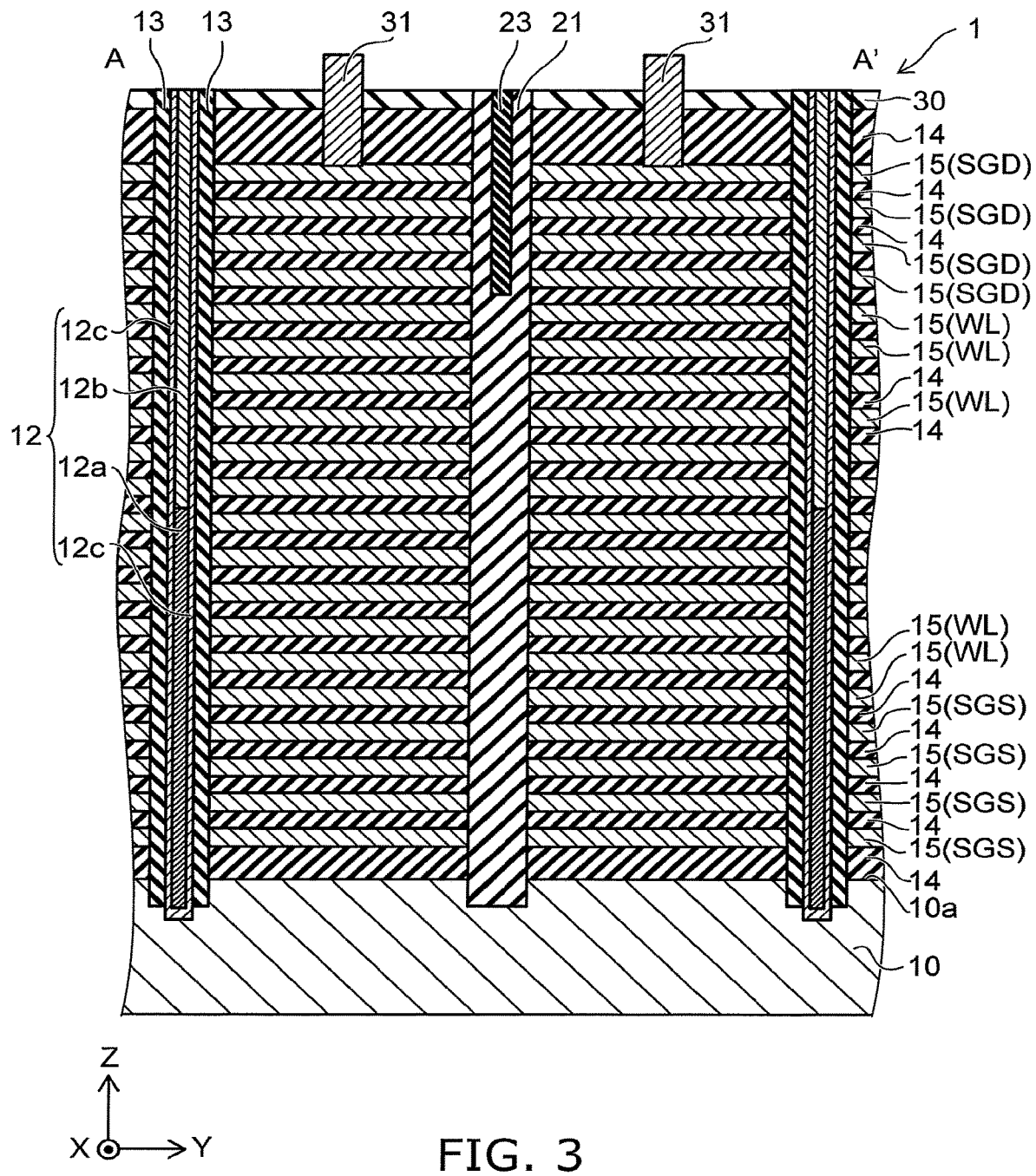

FIGS. 2 and 3 are sectional views showing the semiconductor memory device according to the embodiment.

FIG. 3 is a sectional view taken along line A-A' shown in FIG. 1.

FIG. 4A is a sectional view showing the silicon pillar 20 and its surroundings in the semiconductor memory device according to the embodiment. FIG. 4B is a sectional view showing the insulating member 23 and its surroundings. FIG. 4C is a sectional view showing the strut 22 and its surroundings. FIG. 4D is a sectional view showing the insulating member 21 and its surroundings. FIG. 4E is a sectional view showing the insulating plate 13 and its surroundings.

The drawings are schematic, and are depicted with exaggeration as appropriate. For instance, in several figures, the depicted components are fewer and larger than in reality. The figures are not necessarily consistent in the number and size ratio of components.

The semiconductor memory device according to the embodiment is a stacked NAND flash memory.

As shown in FIGS. 1 to 3, the semiconductor memory device 1 according to the embodiment is provided with a silicon substrate 10. In this specification, an XYZ orthogonal coordinate system is hereinafter adopted for convenience of description. Two directions parallel to the upper surface 10a of the silicon substrate 10 and orthogonal to each other are referred to as "X-direction" and "Y-direction". The direction perpendicular to the upper surface 10a of the silicon substrate 10 is referred to as "Z-direction". The silicon substrate 10 is formed from e.g. a single crystal of silicon.

In this specification, the "silicon substrate" refers to a substrate composed primarily of silicon (Si). The same also applies to the other components. That is, the component with the designation including a material name is composed primarily of that material. Silicon is generally a semiconductor material. Thus, unless otherwise specified, the silicon substrate is a semiconductor substrate. The same also applies to the other members. That is, in principle, the characteristics of the member reflect the characteristics of its main ingredient.

A plurality of stacked bodies 11 and a plurality of conductive plates 12 are provided on the silicon substrate 10. The stacked bodies 11 and the conductive plates 12 are arranged alternately along the Y-direction. An insulating plate 13 made of e.g. silicon oxide (SiO) is provided between the stacked body 11 and the conductive plate 12.

In the stacked body 11, insulating films 14 and electrode films 15 are stacked alternately along the Z-direction on the silicon substrate 10. The insulating film 14 is formed from e.g. silicon oxide.

A silicon member 12a is provided in the conductive plate 12. A tungsten member 12b is provided on the silicon member 12a. A titanium nitride layer 12c is provided on the side surface and on the lower surface of the structural body composed of the silicon member 12a and the tungsten member 12b. The silicon member 12a is formed from polysilicon doped with impurity.

The X-direction end part of the stacked body 11 is shaped like a staircase in which a terrace 17 is formed for each electrode film 15. This end part is hereinafter referred to as "staircase part 18". On the other hand, a silicon pillar 20 extending in the Z-direction is provided in the X-direction central part of the stacked body 11. This central part is hereinafter referred to as "cell part 19".

The thickness ta, i.e. Z-direction length, of the electrode film 15 in the staircase part 18 is thicker than the thickness tb of the electrode film 15 in the cell part 19. That is, ta>tb. On the other hand, the thickness tc of the insulating film 14 in the staircase part 18 is thinner than the thickness td of the insulating film 14 in the cell part 19. That is, tc<td. Thus, the arrangement pitch of the insulating films 14 and electrode films 15 is substantially equal between the staircase part 18 and the cell part 19. That is, ta+tc=tb+td.

A plurality of insulating members 21 are provided in the staircase part 18. The insulating member 21 is made of an insulating material such as silicon oxide at least in the side surface part. The insulating member 21 is shaped like a generally quadrangular column or a generally circular column with the longitudinal direction in the Z-direction. The plurality of insulating members 21 are arranged e.g. intermittently in a row along the X-direction in the Y-direction central part of the stacked body 11 in the staircase part 18. The insulating member 21 penetrates through the stacked body 11 and is in contact with the silicon substrate 10. The insulating member 21 is spaced from the insulating plate 13. FIG. 3 shows an example in which the insulating material is buried to the center of the insulating member 21. However, as described later, a structure similar to the conductive plate 12 may be formed in the insulating member 21. Nonetheless, this structure is insulated from the electrode film 15.

In the staircase part 18, a plurality of struts 22 are provided at positions not interfering with the insulating member 21. The strut 22 is also made of e.g. silicon oxide. The strut 22 is shaped like a generally circular column extending in the Z-direction. The strut 22 also penetrates through the stacked body 11 and is in contact with the silicon substrate 10.

In the cell part 19, a large number of silicon pillars 20 are arranged in e.g. nine rows along the X-direction. For instance, the X-direction positions of the silicon pillars 20 belonging to the adjacent rows are shifted by a half pitch relative to each other. Thus, the nine rows of silicon pillars 20 are arranged in a staggered arrangement.

An insulating member 23 shaped like a strip extending in the X-direction is provided in an upper part of the stacked body 11. The insulating member 23 is placed in the Y-direction central part of the stacked body 11. By the insulating member 23, one or more electrode films 15 on the upper layer side of the stacked body 11 are divided into two in the Y-direction. The insulating member 23 bites into an upper part of the silicon pillar 20 belonging to the central row among the silicon pillars 20 arranged in nine rows.

An interlayer insulating film 30 made of e.g. silicon oxide is provided on the stacked body 11. A plurality of contacts 31 are provided in the interlayer insulating film 30. Each contact 31 extends in the Z-direction. The lower end of the contact 31 is connected to the corresponding electrode film 15 in the terrace 17. The lower end of the contact 31 intrudes into the electrode film 15, but does not penetrate through the electrode film 15. The degree of intrusion is larger in the electrode film 15 at the upper stage.

A plug 32 is provided in the interlayer insulating film 30. The lower end of each plug 32 is connected to the upper end of the corresponding silicon pillar 20. A source line 34 (see FIG. 21) is provided in part of the immediately overlying region of the cell part 19 of the stacked body 11 in the interlayer insulating film 30. The source line 34 extends in the Y-direction and is connected to the upper end of the conductive plate 12.

An extraction interconnect 35 and a bit line 36 are provided on the interlayer insulating film 30. The extraction interconnect 35 is connected to the upper end of the contact 31. The bit line 36 is connected to the upper end of the plug 32. The bit line 36 extends in the Y-direction. An upper layer insulating film 38 is provided on the interlayer insulating film 30 so as to cover the extraction interconnect 35 and the bit line 36.

In the stacked body 11, the one or more electrode films 15 from the top divided by the insulating member 23 function as an upper select gate line SGD. An upper select gate transistor STD is configured for each intersecting portion of the upper select gate line SGD and the silicon pillar 20. One or more electrode films 15 from the bottom function as a lower select gate line SGS. A lower select gate transistor STS is configured for each intersecting portion of the lower select gate line SGS and the silicon pillar 20. The electrode films 15 other than the lower select gate line SGS and the upper select gate line SGD function as word lines WL. A memory cell transistor MC is configured for each intersecting portion of the word line WL and the silicon pillar 20. The lower select gate line SGS and the word line WL are not divided by the insulating member 23. Thus, a plurality of memory cell transistors MC are connected in series along each silicon pillar 20. The lower select gate transistor STS and the upper select gate transistor STD are connected to both ends thereof. Thus, a NAND string is formed.

As shown in FIG. 4A, the silicon pillar 20 is made of e.g. polysilicon and shaped like a circular cylinder with the lower end occluded. The lower end of the silicon pillar 20 is connected to the silicon substrate 10. A core member 25 made of e.g. silicon oxide is provided in the silicon pillar 20.

A tunnel insulating film 26 is provided on the side surface of the silicon pillar 20. The tunnel insulating film 26 is a film that is normally insulating but passes a tunnel current under application of a prescribed voltage within the range of the driving voltage of the semiconductor memory device 1. The tunnel insulating film 26 may be e.g. a monolayer silicon oxide film, or an ONO film in which a silicon oxide layer, a silicon nitride layer, and a silicon oxide layer are stacked in this order.

A charge storage film 27 is provided on the surface of the tunnel insulating film 26. The charge storage film 27 is a film capable of storing charge. The charge storage film 27 is formed from a material containing electron trap sites. For instance, the charge storage film 27 is formed from silicon nitride (SiN).

A block insulating film 28 is provided on the surface of the charge storage film 27. The block insulating film 28 is a film passing substantially no current even under application of voltage within the range of the driving voltage of the semiconductor memory device 1. The block insulating film 28 is e.g. a two-layer film in which a silicon oxide layer 28a and an aluminum oxide layer 28b are stacked from the charge storage film 27 side. The tunnel insulating film 26, the charge storage film 27, and the silicon oxide layer 28a are placed generally entirely on the side surface of the silicon pillar 20, and shaped like a circular cylinder. The aluminum oxide layer 28b is formed on the upper surface, on the lower surface, and on the side surface facing the silicon pillar 20, of the electrode film 15.

The electrode film 15 is provided with a body part 15a and a barrier metal layer 15b. The body part 15a is formed from e.g. tungsten (W). The barrier metal layer 15b is formed from e.g. titanium nitride (TiN). The barrier metal layer 15b covers part of the surface of the body part 15a. As shown in FIG. 4A, the barrier metal layer 15b is placed between the body part 15a and the aluminum oxide layer 28b. As described later, the barrier metal layer 15b covers the surface of the body part 15a except the side surface in contact with the insulating plate 13 and the side surface in contact with the insulating member 21.

As shown in FIG. 4B, the aluminum oxide layer 28b and the barrier metal layer 15b are interposed between the insulating member 23 provided in the upper part of the stacked body 11 and the body part 15a of the electrode film 15. The insulating member 23 is in contact with the insulating film 14.

As shown in FIG. 4C, the aluminum oxide layer 28b and the barrier metal layer 15b are interposed between the strut 22 provided in the staircase part 18 of the stacked body 11 and the body part 15a of the electrode film 15. The strut 22 is in contact with the insulating film 14.

In contrast, as shown in FIG. 4D, the aluminum oxide layer 28b and the barrier metal layer 15b are not interposed between the insulating member 21 provided in the staircase part 18 of the stacked body 11 and the body part 15a of the electrode film 15. That is, the insulating member 21 is in contact with the body part 15a. The insulating member 21 is in contact with also the insulating film 14.

Likewise, as shown in FIG. 4E, the aluminum oxide layer 28b and the barrier metal layer 15b are not interposed between the insulating plate 13 and the body part 15a. That is, the insulating plate 13 is in contact with the body part 15a. The insulating plate 13 is in contact with also the insulating film 14.

Next, a method for manufacturing the semiconductor memory device according to the embodiment is described.

FIGS. 5A to 8B are sectional views showing a method for manufacturing the semiconductor memory device according to the embodiment.

Figure 9A:
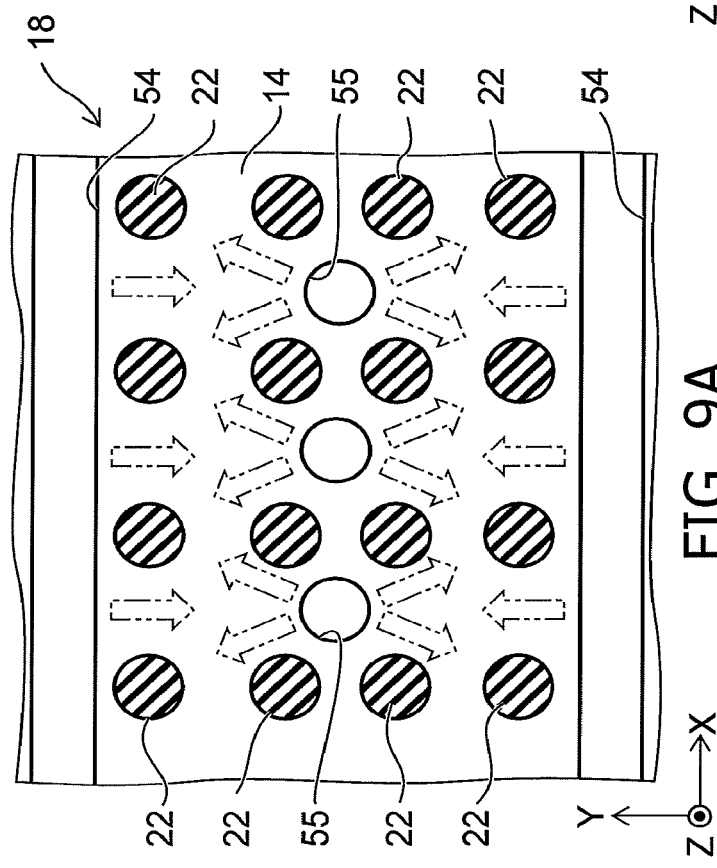
FIGS. 9A and 9B schematically show a progress of etching in the staircase part, and FIGS. 9C and 9D schematically show the progress of etching in a cell part.
Figure 9B:
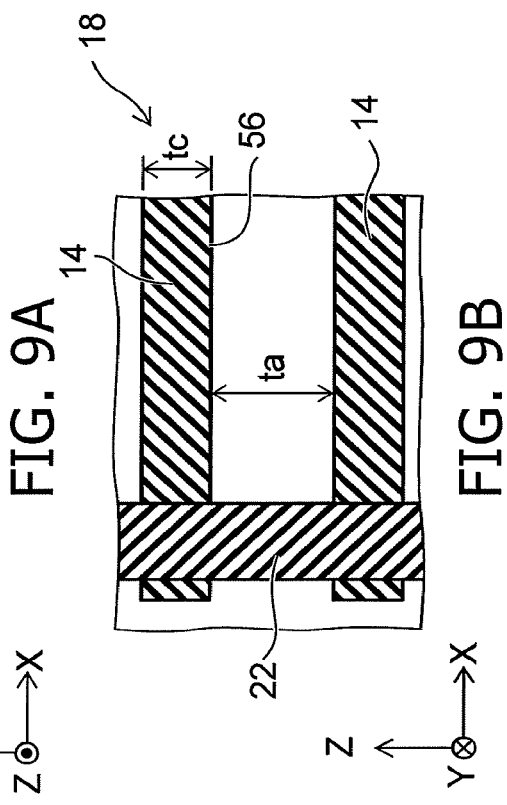
Figure 9C:
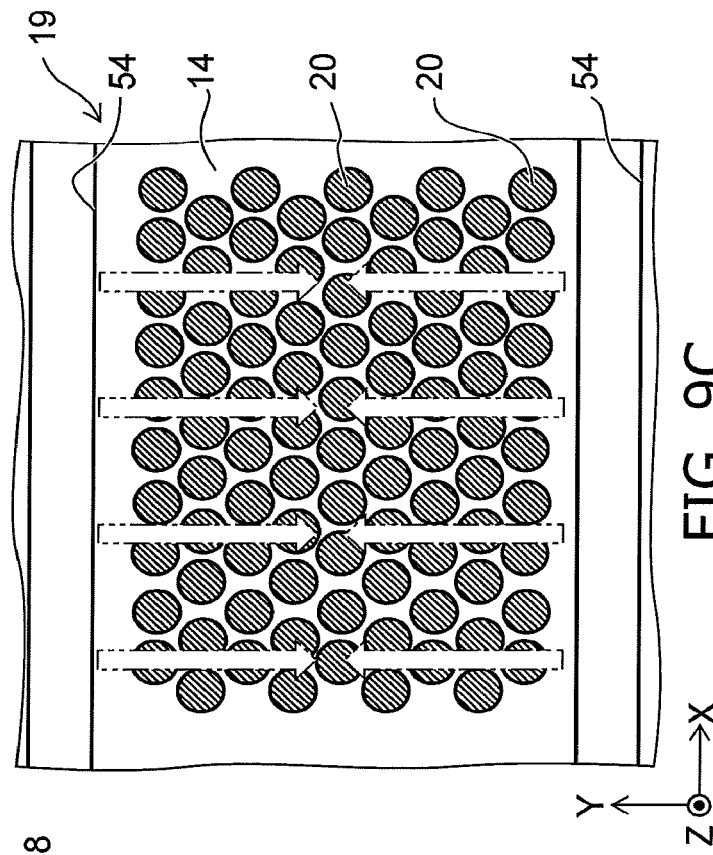
Figure 9D:
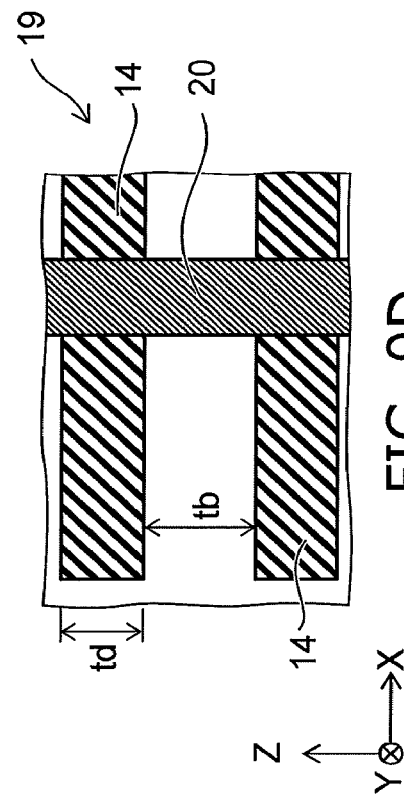

FIGS. 9A and 9B schematically show the progress of etching in the staircase part. FIGS. 9C and 9D schematically show the progress of etching in the cell part.

Figure 10:
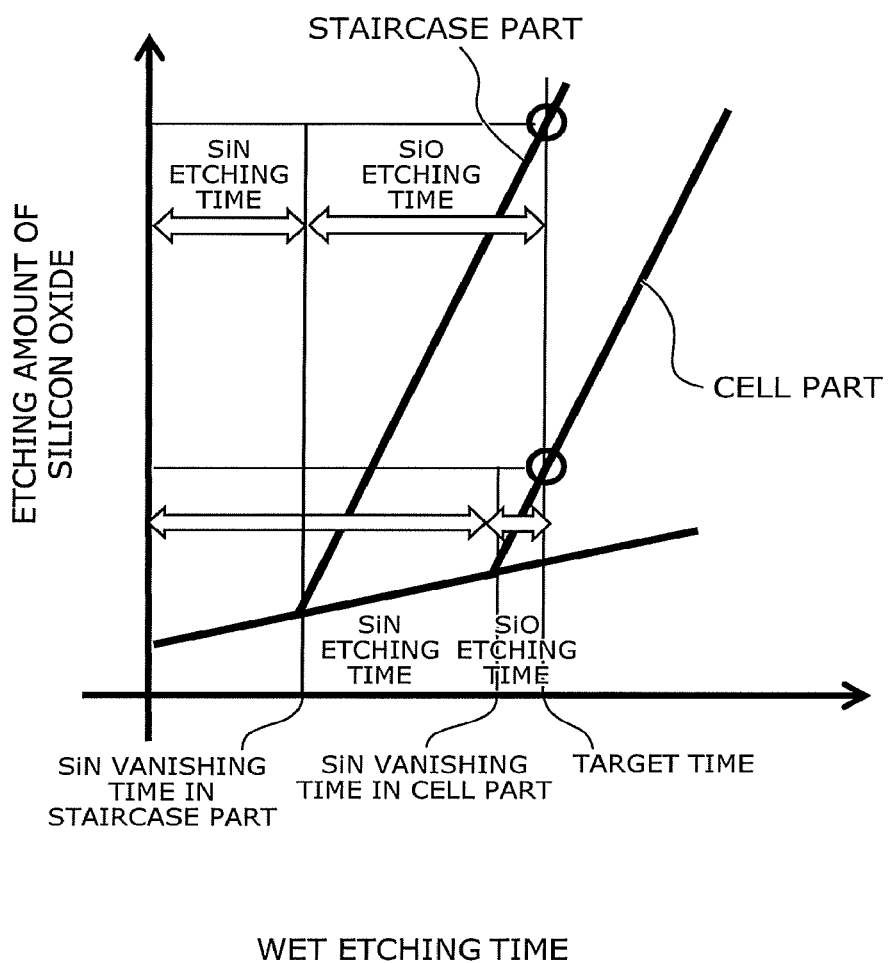
FIG. 10 is a graph showing the development of wet etching, the horizontal axis represents wet etching time, and the vertical axis represents an etching amount of silicon oxide.

FIG. 10 is a graph showing the development of wet etching. The horizontal axis represents wet etching time. The vertical axis represents the etching amount of silicon oxide.

FIGS. 11A to 17 are sectional views showing the method for manufacturing the semiconductor memory device according to the embodiment.

Figures 5A, 5B:
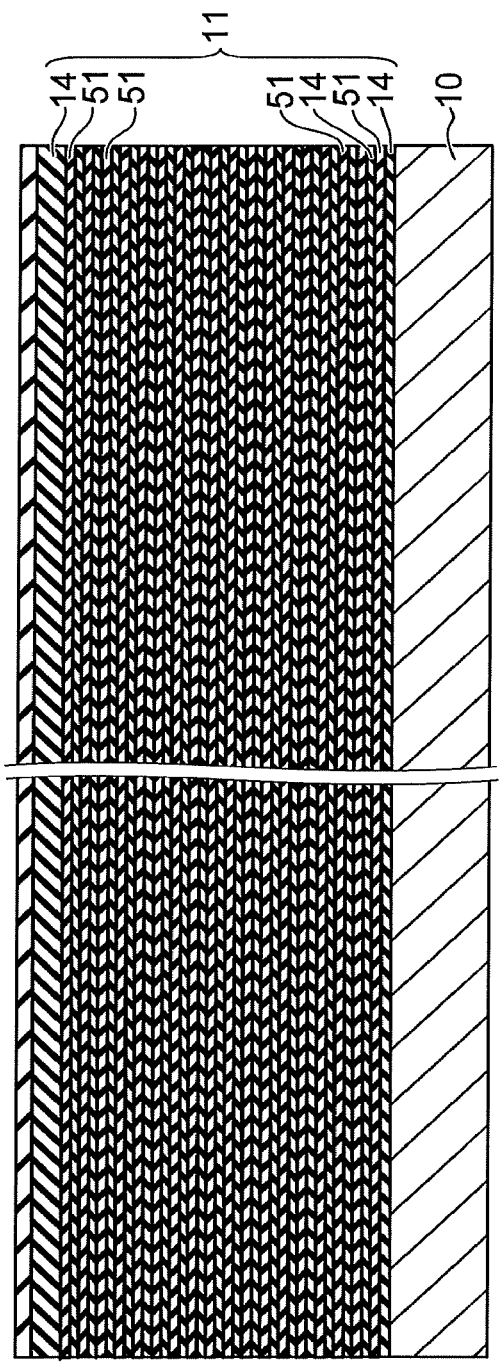

FIGS. 5A and 5B show mutually orthogonal cross sections in the same step. The same also applies to FIGS. 6A to 8B, FIGS. 11A to 16B.

First, as shown in FIGS. 5A and 5B, insulating films 14 made of silicon oxide (SiO) and sacrificial films 51 made of silicon nitride (SiN) are alternately stacked on a silicon substrate 10 to form a stacked body 11 of ONON structure.

Figures 6A, 6B:
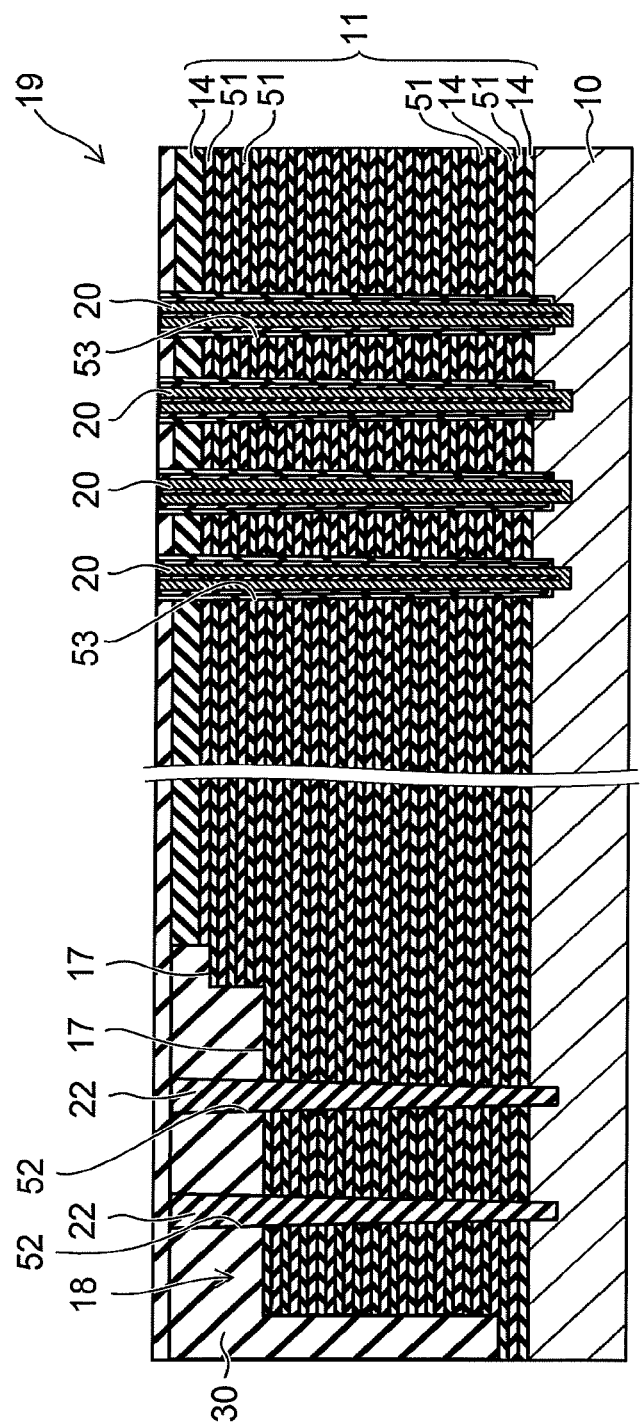

Next, as shown in FIGS. 6A and 6B, the end part of the stacked body 11 is processed in a staircase shape. Thus, the staircase part 18 is formed. Next, an interlayer insulating film 30 is formed so as to cover the staircase part 18. Next, by anisotropic etching such as RIE (reactive ion etching), a strut hole 52 is formed in the interlayer insulating film 30 and in the staircase part 18, and a memory hole 53 is formed in the cell part 19. Next, silicon oxide is buried in the strut hole 52 to form a strut 22. A silicon oxide layer 28a, a charge storage film 27, a tunnel insulating film 26, a silicon pillar 20, and a core member 25 (see FIG. 4A) are buried on the inner side surface of the memory hole 53. Next, silicon oxide is deposited on the entire surface, and CMP (chemical mechanical polishing) is performed on the upper surface.

Figures 7A, 7B:
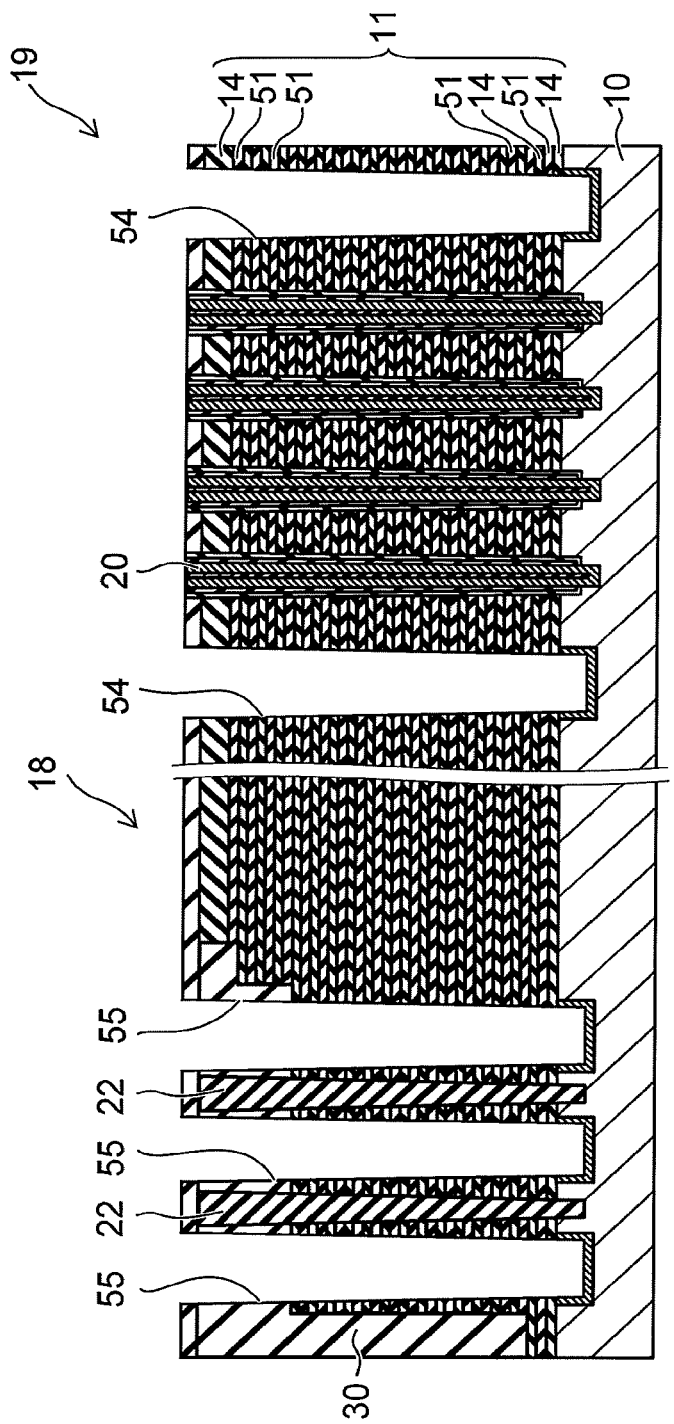

Next, as shown in FIGS. 7A and 7B, by performing e.g. RIE, slits 54 extending in the X-direction are formed in the stacked body 11, and holes 55 shaped like a quadrangular column or a circular column are formed in the staircase part 18. The slit 54 and the hole 55 penetrate through the stacked body 11 and reach the silicon substrate 10. For instance, the holes 55 are arranged in a row along the center line between the slits 54.

Next, as shown in FIGS. 8A and 8B, wet etching is performed with hot phosphoric acid. Thus, the sacrificial film 51 (see FIGS. 7A and 7B) made of silicon nitride is removed through the slit 54 and the hole 55 to form a space 56. At this time, the insulating film 14 made of silicon oxide is etched to some extent. At this time, the silicon pillar 20 and the strut 22 support the stacked body 11.

As shown in FIGS. 8A, 8B, 9A, and 9C, only the slit 54 is formed in the cell part 19. Both the slit 54 and the hole 55 are formed in the staircase part 18. Thus, the distance by which etching needs to progress in order to remove the sacrificial film 51 (hereinafter referred to as "etching progress distance") in the staircase part 18 is shorter than the etching progress distance in the cell part 19.

As shown in FIG. 10, hot phosphoric acid selectively etches silicon nitride relative to silicon oxide. Thus, in the coexisting environment of silicon oxide and silicon nitride, silicon nitride is preferentially etched, and the etching rate of silicon oxide is low. However, when silicon nitride is completely etched in a region, the etching rate of silicon oxide increases. The staircase part 18 is shorter in etching progress distance than the cell part 19. Thus, in the staircase part 18, the timing of completely etching the sacrificial film 51 is earlier, and the time period of etching the insulating film 14 at a high etching rate is longer. Accordingly, the etching amount of the insulating film 14 is larger.

As a result, as shown in FIGS. 9B and 9D, the height ta, i.e. Z-direction length, of the space 56 in the staircase part 18 is higher than the height tb of the space 56 in the cell part 19. Conversely, the thickness tc of the insulating film 14 in the staircase part 18 is thinner than the thickness td of the insulating film 14 in the cell part 19.

Next, as shown in FIGS. 11A, 11B, 4A to 4E, aluminum oxide is deposited on the entire surface. Thus, an aluminum oxide layer 28b is formed on the inner surface of the slit 54, the hole 55, and the space 56. Next, titanium nitride is deposited on the entire surface. Thus, a barrier metal layer 15b is formed on the surface of the aluminum oxide layer 28b. Next, tungsten is deposited on the entire surface. Thus, a tungsten film 57 is formed on the surface of the barrier metal layer 15b. At this time, the space 56 is buried with the tungsten film 57 to form a body part 15a. The barrier metal layer 15b and the body part 15a formed in the space 56 form an electrode film 15. The thickness of the electrode film 15 is equal to the height of the space 56. Thus, the thickness ta of the electrode film 15 in the staircase part 18 is thicker than the thickness tb of the electrode film 15 in the cell part 19.

Figures 12A, 12B:
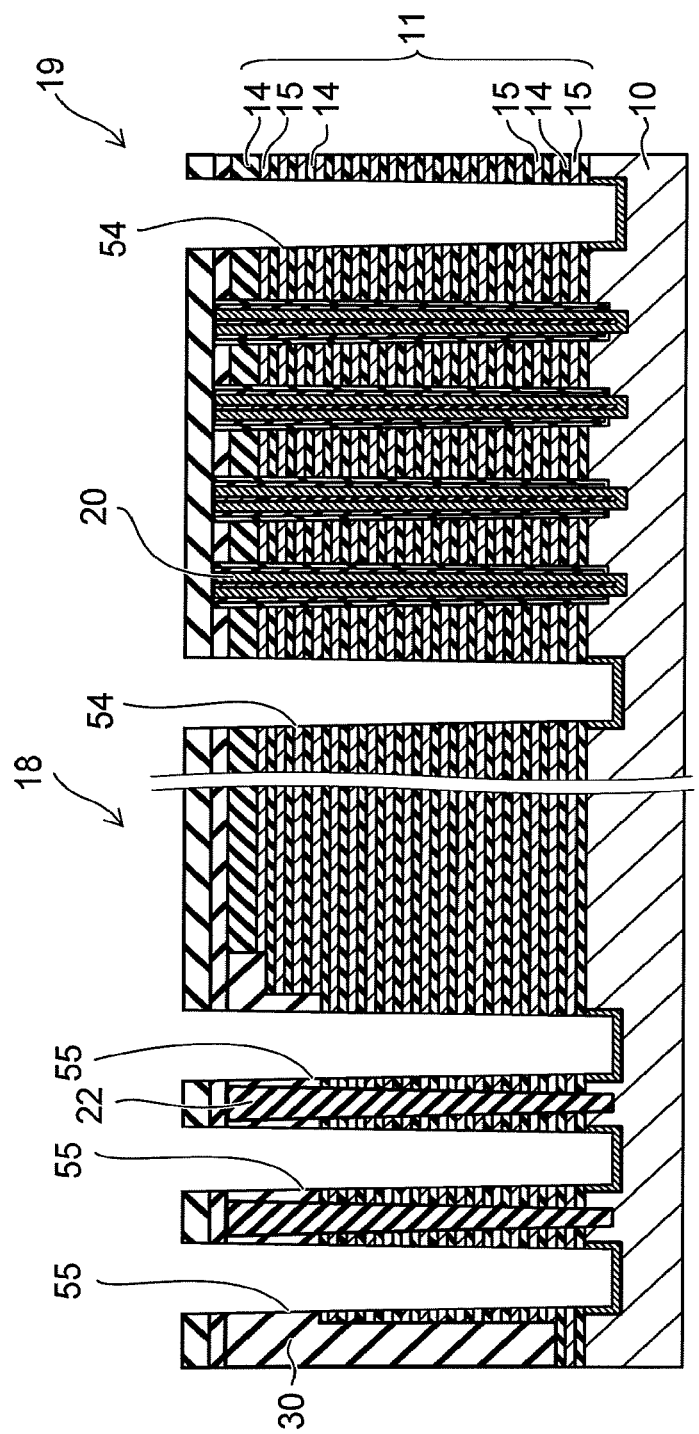

Next, as shown in FIGS. 12A and 12B, RIE is performed to remove the portion of the tungsten film 57, the barrier metal layer 15b, and the aluminum oxide layer 28b deposited in the slit 54 and the hole 55.

Figures 13A, 13B:
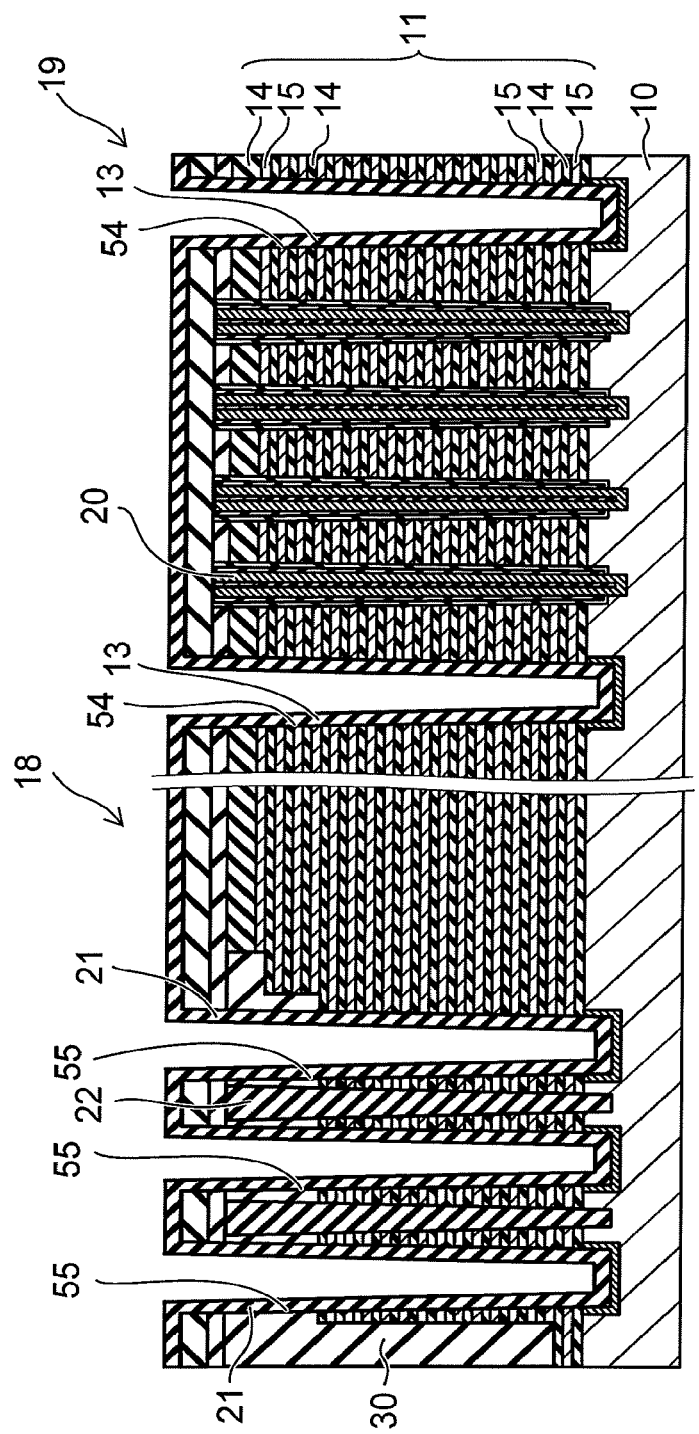

Next, as shown in FIGS. 13A and 13B, silicon oxide is deposited on the entire surface. Thus, an insulating plate 13 is formed on the side surface of the slit 54, and an insulating member 21 is buried on the inner surface of the hole 55. Whether or not the hole 55 is entirely buried with silicon oxide depends on the relationship between the diameter of the hole 55 and the deposition amount of silicon oxide. For a given deposition amount of silicon oxide, if the diameter of the hole 55 is sufficiently small, the hole 55 is entirely buried with silicon oxide to form a gapless insulating member 21. If the diameter of the hole 55 is larger than that, the lower part of the hole 55 is buried with silicon oxide, and a gap is formed in the upper part. If the diameter of the hole 55 is still larger and comparable to or larger than the width of the slit 54, a gap is formed generally entirely in the hole 55. FIGS. 13A and 13B show an example in which the diameter of the hole 55 is comparable to the width of the slit 54.

Figures 14A, 14B:
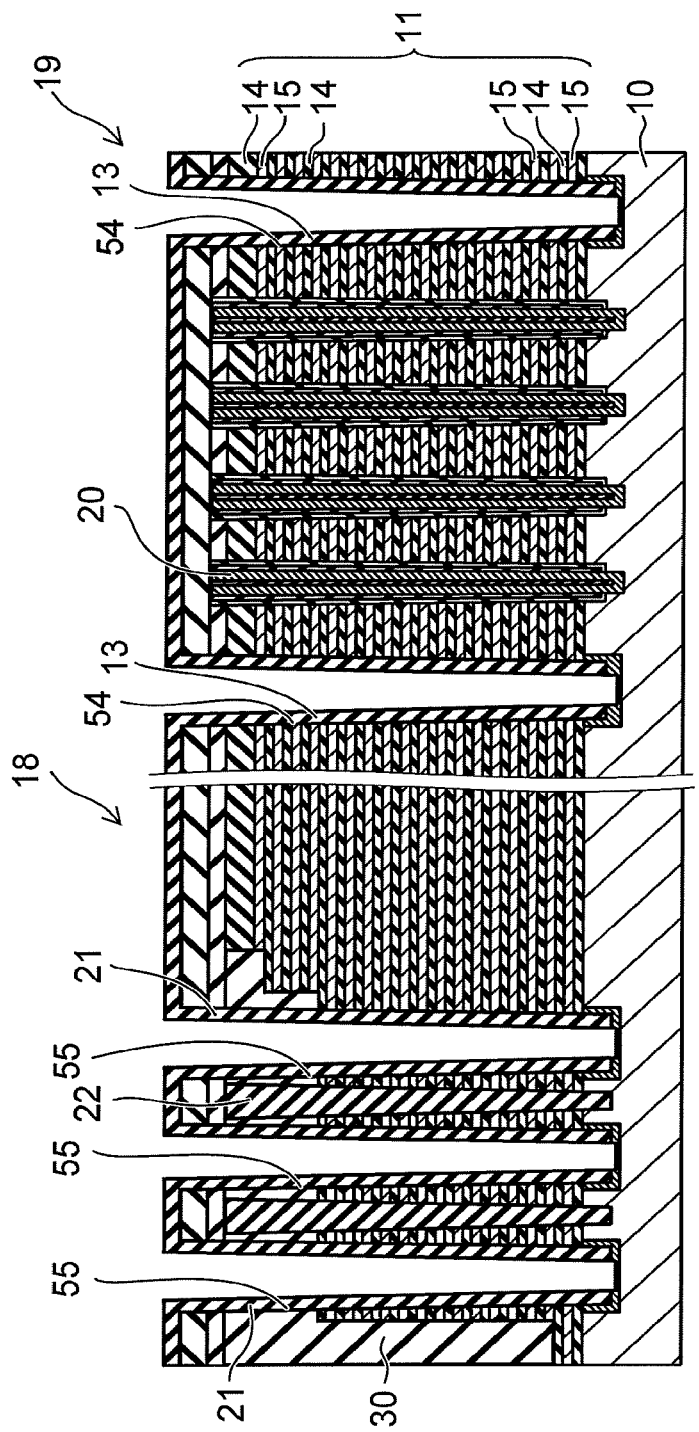

Next, as shown in FIGS. 14A and 14B, RIE is performed to remove the insulating plate 13 from above the bottom surface of the slit 54. Thus, the silicon substrate 10 is exposed. At this time, if the diameter of the hole 55 is comparable to or larger than the width of the slit 54, the insulating member 21 is also removed from the bottom surface of the hole 55, and the silicon substrate 10 is exposed.

Figures 15A, 15B:
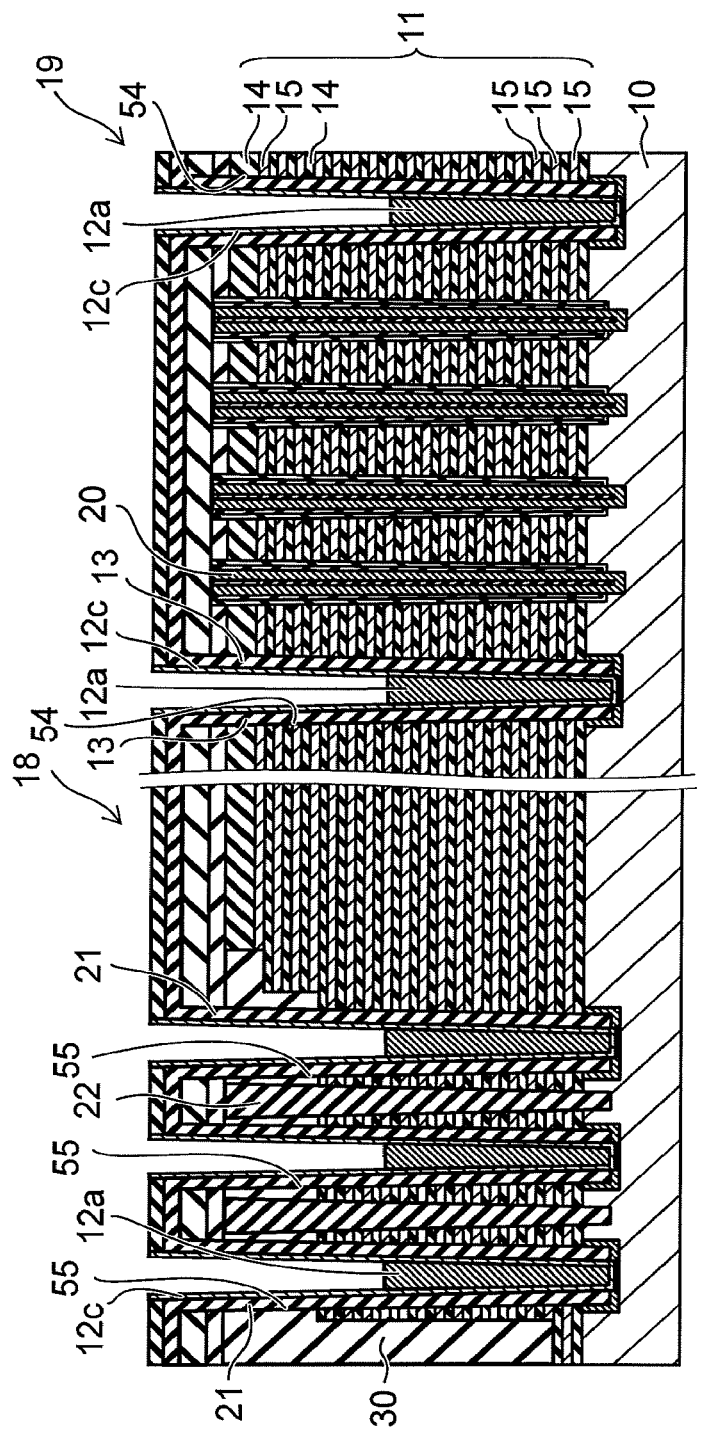

Next, as shown in FIGS. 15A and 15B, titanium nitride is deposited. Thus, a titanium nitride layer 12c is formed on the inner surface of the slit 54. Next, silicon oxide is deposited, and then etched back by RIE. Thus, a silicon member 12a is buried in the lower part of the slit 54.

Figures 16A, 16B:
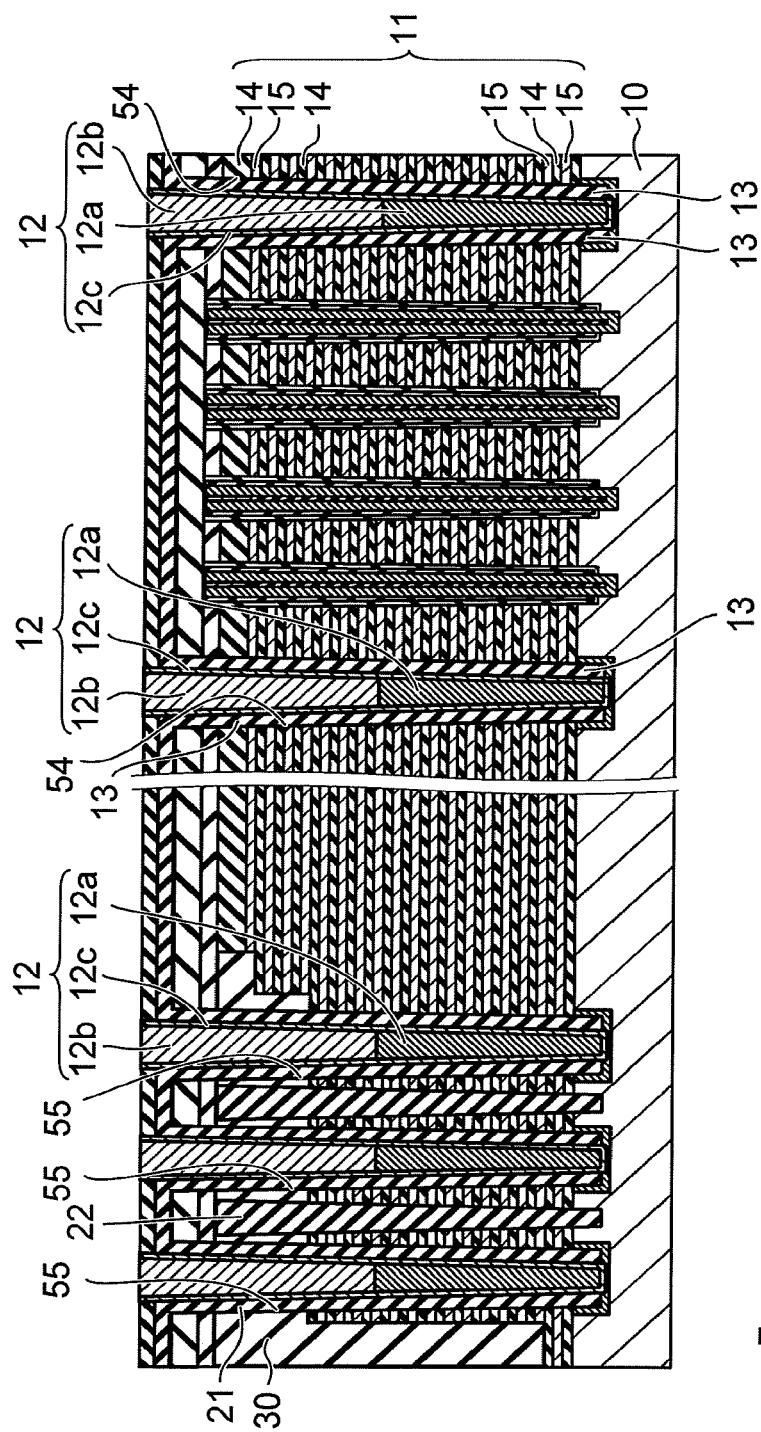

Next, as shown in FIGS. 16A and 16B, tungsten is deposited, and CMP is performed. Thus, a tungsten member 12b is buried in the upper part of the slit 54. As a result, a conductive plate 12 is formed in the slit 54. At this time, if the diameter of the hole 55 is comparable to or larger than the width of the slit 54, a structural body similar to the conductive plate 12 is formed also in the hole 55 and connected to the silicon substrate 10. FIGS. 16A and 16B show this example. If the diameter of the hole 55 is slightly smaller than this, the lower part of the hole 55 is buried with the insulating member 21. Then, the structural body similar to the conductive plate 12 is formed only in the upper part of the hole 55, and not connected to the silicon substrate 10.

Next, as shown in FIGS. 1 to 3, a trench extending in the X-direction is formed in the upper part of the Y-direction central part of the stacked body 11 and buried with silicon oxide to form an insulating member 23. Thus, one or more electrode films 15 at the upper stage are divided to constitute an upper select gate line SGD. Next, an interlayer insulating film 30 is further formed to cover the upper surface of the stacked body 11.

Figure 17:
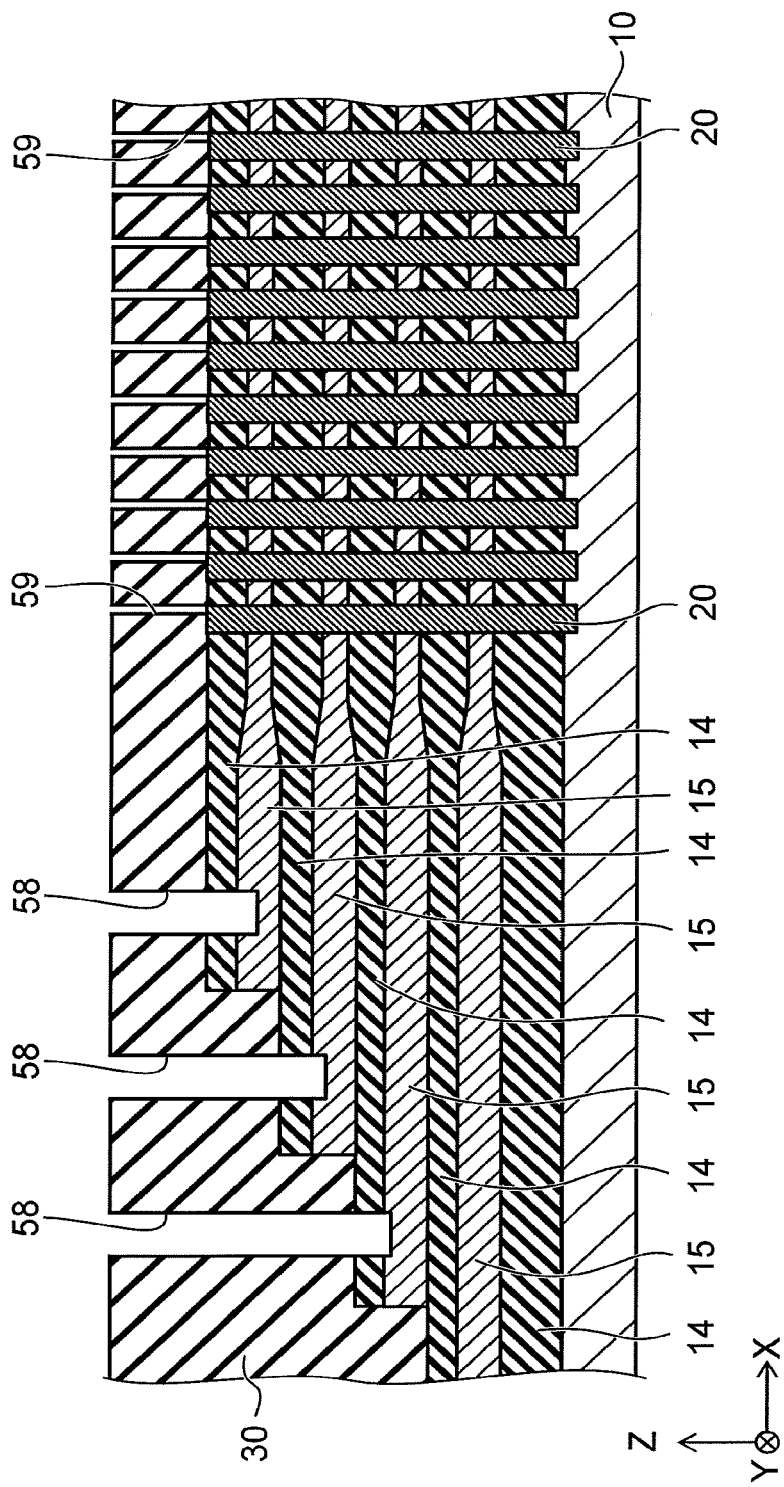

Next, as shown in FIG. 17, the electrode film 15 is used as an etching stopper to perform anisotropic etching such as RIE. Thus, a contact hole 58 is formed immediately above the terrace 17 in the interlayer insulating film 30. A plug hole 59 is formed immediately above the silicon pillar 20 in the interlayer insulating film 30.

The depth of the contact hole 58 depends on the Z-direction position of the target electrode film 15. Thus, the depth of the contact hole 58 extended to the uppermost electrode film 15 is greatly different from the depth of the contact hole 58 extended to the lowermost electrode film 15. Accordingly, after etching is started, the uppermost electrode film 15 is first exposed at the bottom surface of the contact hole 58. However, etching is further continued until the contact hole 58 reaches the lowermost electrode film 15. In the meantime, the uppermost electrode film 15 is exposed to etching, and the lower end of the contact hole 58 intrudes into the electrode film 15. However, in the embodiment, the electrode film 15 is thickly formed in the staircase part 18. This can prevent the contact hole 58 from penetrating through the electrode film 15.

Next, as shown in FIGS. 1 to 3, a contact 31 is formed in the contact hole 58. A plug 32 is formed in the plug hole 59. Next, on the interlayer insulating film 30, an extraction interconnect 35 is formed and connected to the contact 31, and a bit line 36 is formed and connected to the plug 32. Next, an upper layer insulating film 38 is formed to bury the extraction interconnect 35 and the bit line 36. Thus, the semiconductor memory device 1 according to the embodiment is manufactured.

Next, the effect of the embodiment is described.

In the embodiment, in the step shown in FIGS. 7A and 7B, the hole 55 is formed only in the staircase part 18. Thus, in the step of wet etching the sacrificial film 51 shown in FIGS. 8A to 9D, the etching amount of the insulating film 14 in the staircase part 18 is larger than the etching amount of the insulating film 14 in the cell part 19. As a result, the height of the space 56 in the staircase part 18 is higher than the height of the space 56 in the cell part 19. Thus, in the step shown in FIGS. 11A and 11B, when the electrode film 15 is formed in the space 56, the electrode film 15 placed in the staircase part 18 is thicker than the electrode film 15 placed in the cell part 19.

As a result, in the step of forming the contact hole 58 shown in FIG. 17, the number of stacked layers of the stacked body 11 may be increased, and the depth of the contact hole 58 reaching the lowermost electrode film 15 may be deepened. Even in this case, the embodiment can suppress that the electrode films 15 at the upper stage are penetrated by the contact hole 58. This provides a large margin for forming the contact hole 58.

On the other hand, in the cell part 19, the thickness of the electrode film 15 can be determined in accordance with the characteristics required for the memory cell transistor MC. For instance, the channel length of the memory cell transistor MC can be made shorter by thinning the electrode film 15. Thickening the insulating film 14 can suppress disturbance between the memory cell transistors MC adjacent in the Z-direction. Thus, the embodiment can determine the thickness of the electrode film 15 and the insulating film 14 mutually independently between the staircase part 18 and the cell part 19. As a result, the semiconductor memory device 1 can achieve compatibility between the performance of individual memory cell transistors MC and the ease of manufacturing.

First Variation of the First Embodiment

Next, a first variation of the first embodiment is described.

Figure 18:
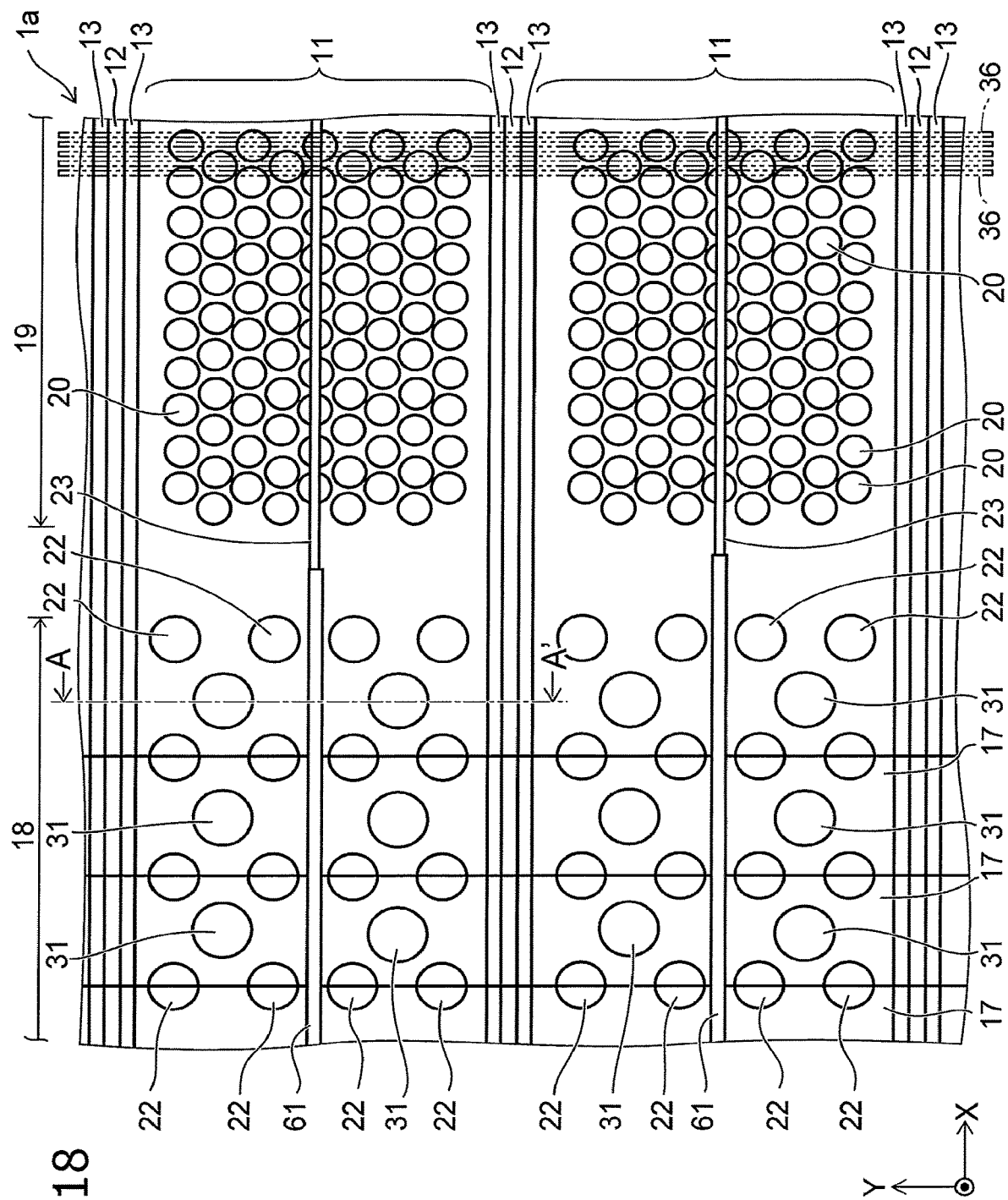
FIG. 18 is a plan view showing a semiconductor memory device according to a first variation of the first embodiment.

FIG. 18 is a plan view showing a semiconductor memory device according to this variation.

Figure 19:
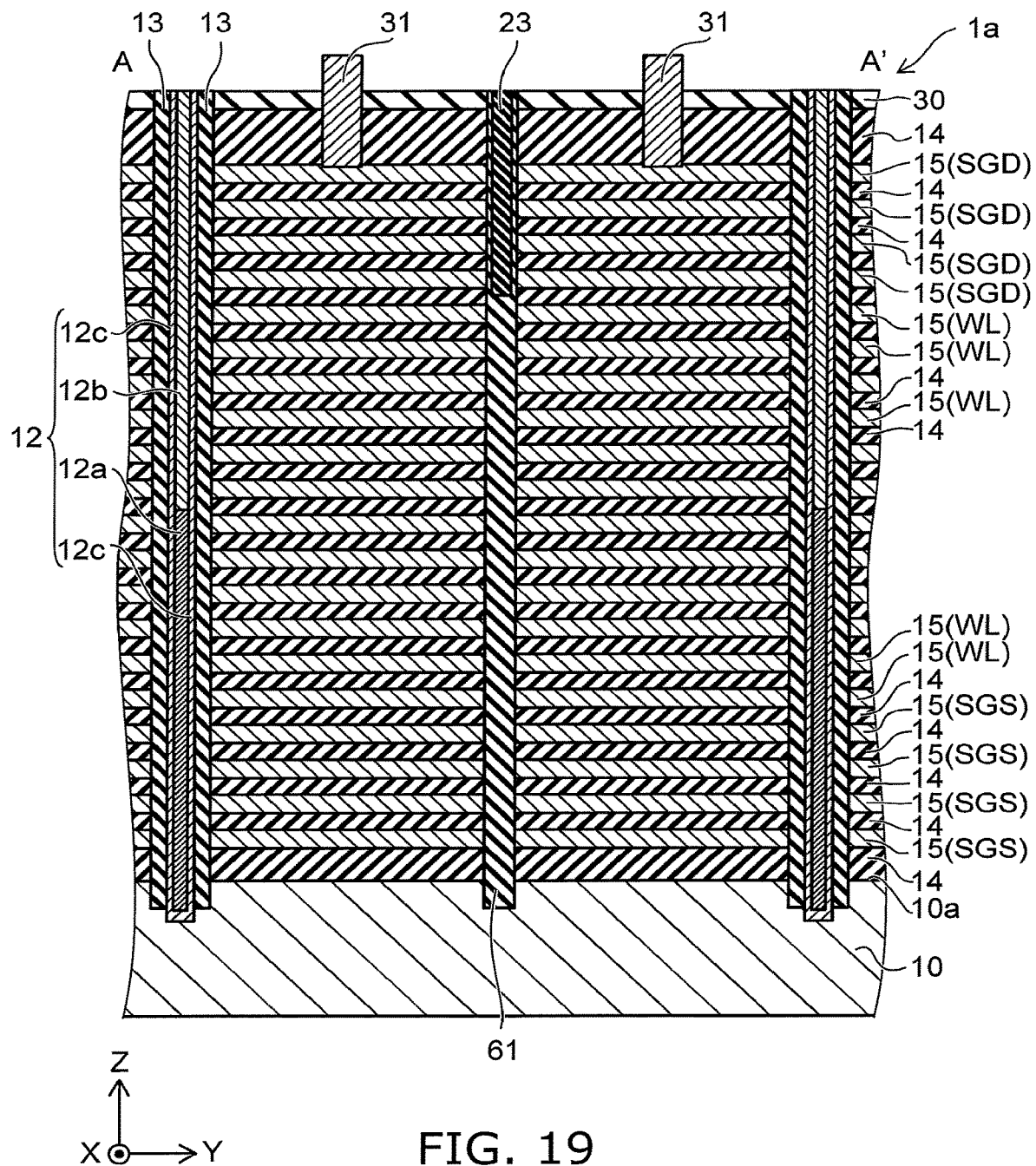
FIG. 19 is a sectional view taken along line A-A' shown in FIG. 18.

FIG. 19 is a sectional view taken along line A-A' shown in FIG. 18.

As shown in FIGS. 18 and 19, the semiconductor memory device 1a according to this variation is different from the semiconductor memory device 1 (see FIG. 1) according to the above first embodiment in that an insulating member 61 is provided instead of the insulating member 21. The insulating member 61 is shaped like a plate extending along the XZ plane. The insulating member 61 penetrates through the stacked body 11 in the Z-direction. The lower end of the insulating member 61 is in contact with the silicon substrate 10. The insulating member 61 is in contact with the insulating member 23.

The configuration, manufacturing method, and effect of this variation other than the foregoing are similar to those of the above first embodiment. That is, also in the semiconductor memory device 1a, the portion of the electrode film 15 placed in the staircase part 18 is thicker than the portion placed in the cell part 19.

Second Variation of the First Embodiment

Next, a second variation of the first embodiment is described.

Figure 20:
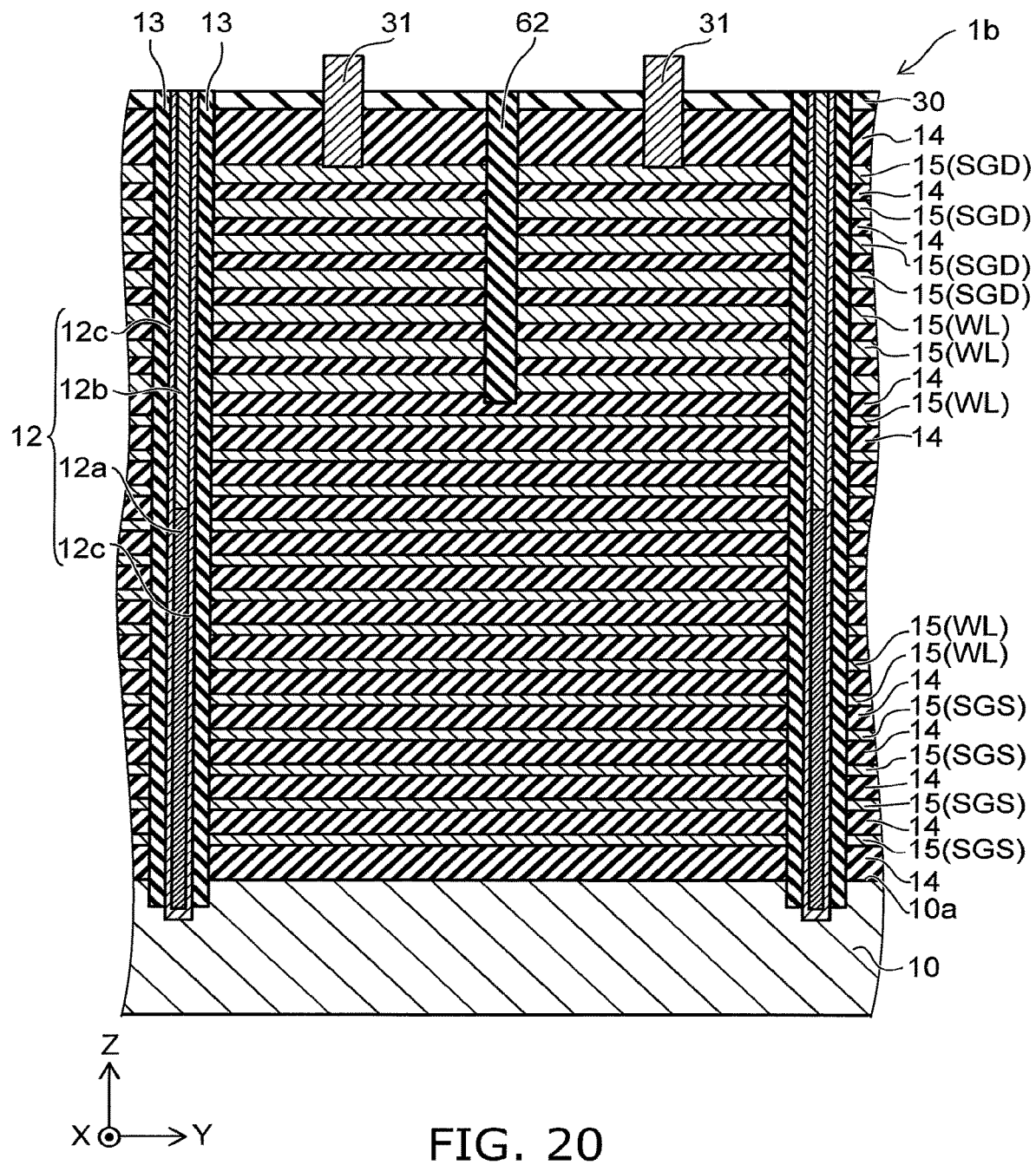
FIG. 20 is a sectional view showing a semiconductor memory device according to a second variation of the first embodiment.

FIG. 20 is a sectional view showing a semiconductor memory device according to this variation.

As shown in FIG. 20, the semiconductor memory device 1b according to this variation is different from the semiconductor memory device 1a (see FIG. 19) according to the above first variation in that an insulating member 62 is provided instead of the insulating member 61. The insulating member 62 is provided only in the upper part of the stacked body 11. Thus, also in the staircase part 18, the thickness of the electrode film 15 varies with the Z-direction position. Specifically, the electrode film 15 is relatively thick in the upper part of the stacked body 11 in the staircase part 18, i.e. the position reached by the insulating member 62. On the other hand, the electrode film 15 is relatively thin in the lower part of the stacked body 11 in the staircase part 18, i.e. the position not reached by the insulating member 62. At this position, the thickness is comparable to the thickness of the electrode film 15 in the cell part 19.

In etching for forming the contact hole 52, the electrode films 15 at the upper stage are particularly prone to overetching. According to this variation, these electrode films 15 can be thickly formed. This can achieve an effect similar to that of the above first embodiment.

The configuration, manufacturing method, and effect of this variation other than the foregoing are similar to those of the above first variation.

Second Embodiment

Next, a second embodiment is described.

Figure 21:
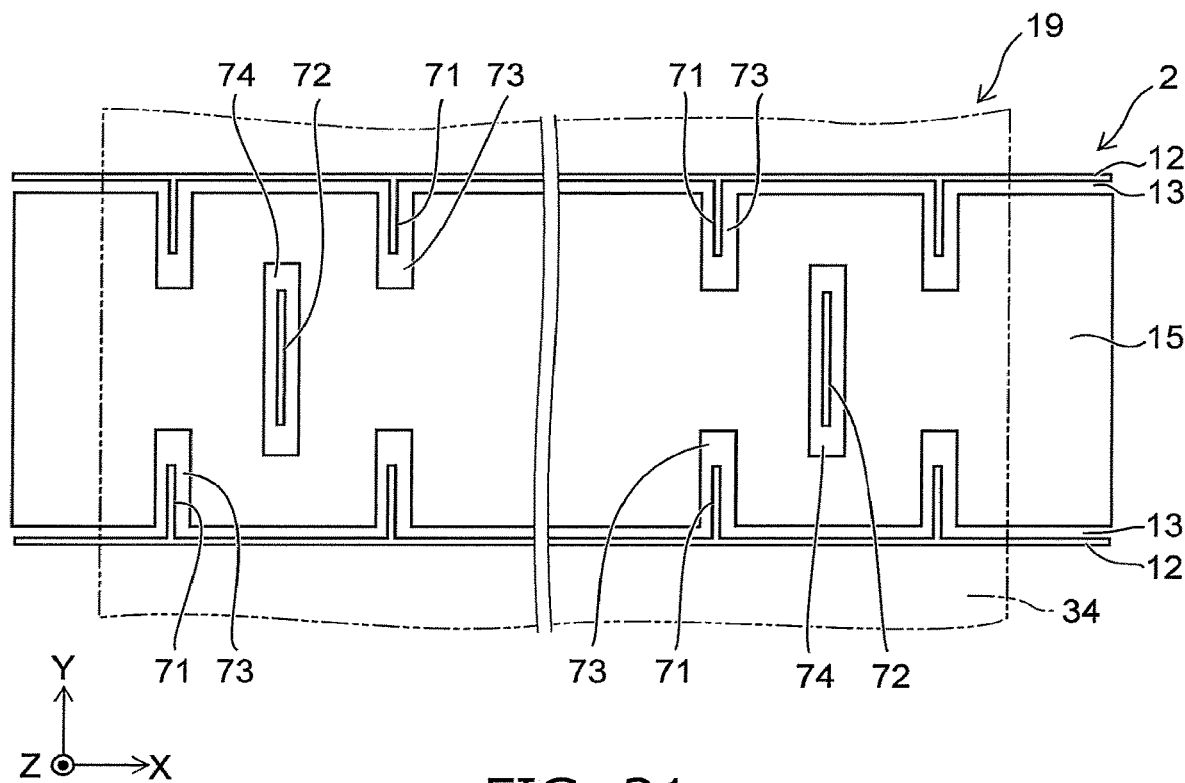
FIG. 21 is a plan view showing a semiconductor memory device according to a second embodiment.

FIG. 21 is a plan view showing a semiconductor memory device according to the embodiment.

As shown in FIG. 21, in the semiconductor memory device 2 according to the embodiment, a respective plurality of conductive plates 71 and 72 are provided in the cell part 19. The conductive plates 71 and 72 are placed immediately below the source line 34 extending in the Y-direction, i.e. in a shunt part between the cells.

The conductive plates 71 and 72 extend in the Y-direction and penetrate through the stacked body 11 in the Z-direction. The conductive plate 71 is connected to the conductive plate 12. As viewed in the Z-direction, an insulating plate 73 is provided around the conductive plate 71. The insulating plate 73 is in contact with the insulating plate 13. The conductive plate 72 is spaced from the conductive plate 12. As viewed in the Z-direction, an insulating plate 74 is provided around the conductive plate 72. The insulating plate 74 is spaced from the insulating plate 13. For instance, the conductive plates 71 and 72 are formed from tungsten. The insulating plates 73 and 74 are formed from silicon oxide.

The barrier metal layer 15b (see FIG. 4A) of the electrode film 15 is not placed between the body part 15a of the electrode film 15 and the insulating plate 73, and between the body part 15a and the insulating plate 74. The aluminum oxide layer 28b (see FIG. 4A) of the block insulating film 28 is also not placed between the body part 15a of the electrode film 15 and the insulating plate 73, and between the body part 15a and the insulating plate 74.

In the embodiment, the electrode films 15 containing tungsten are partly divided in the X-direction by the conductive plate 71 and the insulating plate 73, and the conductive plate 72 and the insulating plate 74. This relaxes compressive stress in the X-direction of the electrode film 15. Thus, warpage of the wafer can be suppressed in the manufacturing process of the semiconductor memory device 2. This facilitates transporting and handling the wafer.

In the embodiment, the conductive plates 71 and 72 and the insulating plates 73 and 74 are placed immediately below the source line 34, i.e. in the shunt part between the cells. Originally, the shunt part cannot connect the silicon pillar 20 to the bit line 36. Thus, the shunt part is a region in which no memory cell transistor MC can be formed. Thus, the embodiment can effectively utilize the dead space and suppress the size increase of the device caused by providing the conductive plates 71 and 72 and the insulating plates 73 and 74.

The conductive plates 71 and 72 and the insulating plates 73 and 74 may be placed in a region other than immediately below the source line 34. Increasing the number of conductive plates 71 and the like further improves the effect of suppressing warpage of the wafer.

The configuration, manufacturing method, and effect of the embodiment other than the foregoing are similar to those of the above first embodiment.

First Variation of the Second Embodiment

Next, a first variation of the second embodiment is described.

Figure 22:
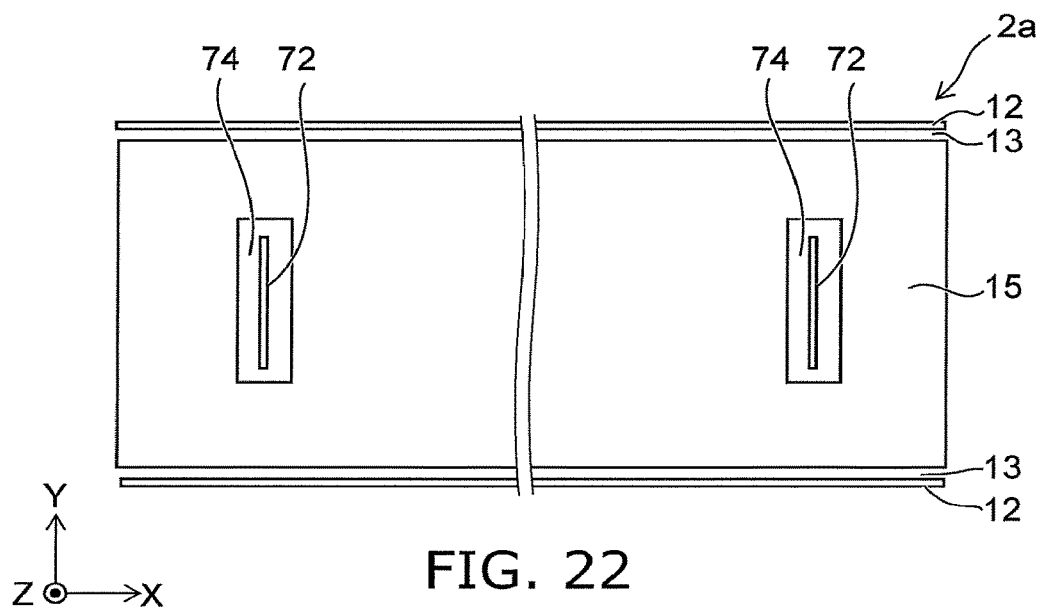
FIG. 22 is a plan view showing a semiconductor memory device according to a first variation of the second embodiment.

FIG. 22 is a plan view showing a semiconductor memory device according to this variation.

As shown in FIG. 22, the semiconductor memory device 2a according to the embodiment is different from the semiconductor memory device 2 (see FIG. 21) according to the second embodiment in that the conductive plate 71 and the insulating plate 73 are not provided.

The configuration, manufacturing method, and effect of this variation other than the foregoing are similar to those of the above second embodiment.

Second Variation of the Second Embodiment

Next, a second variation of the second embodiment is described.

Figure 23:
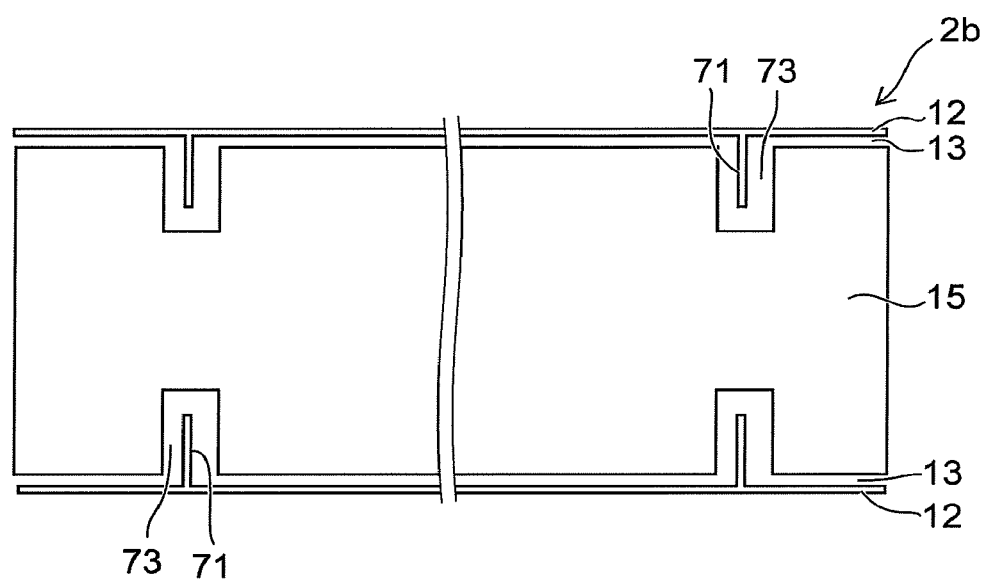
FIG. 23 is a plan view showing a semiconductor memory device according to a second variation of the second embodiment.

FIG. 23 is a plan view showing a semiconductor memory device according to this variation.

As shown in FIG. 23, the semiconductor memory device 2b according to the embodiment is different from the semiconductor memory device 2 (see FIG. 21) according to the second embodiment in that the conductive plate 72 and the insulating plate 74 are not provided.

The configuration, manufacturing method, and effect of this variation other than the foregoing are similar to those of the above second embodiment.

The embodiments described above can realize a semiconductor memory device capable of achieving compatibility between the performance of memory cells and the ease of manufacturing even when the number of stacked layers is increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device comprising:
a stacked body in which electrode films and insulating films are alternately stacked along a first direction, and an end part of the stacked body in a second direction crossing the first direction being shaped like a staircase in which a terrace is formed for each of the electrode films;
a semiconductor member extending in the first direction and penetrating through a central part in the second direction of the stacked body;
a first insulating member extending in the first direction and penetrating through at least one of the electrode films placed in the end part;
a contact provided on the end part and connected to an electrode film of the electrode films in the terrace;
insulating plates provided on both sides of the stacked body in a third direction, the third direction crossing a plane including the first direction and the second direction,
a charge storage member provided between the semiconductor member and the electrode film,
a first insulating layer provided between the charge storage member and the electrode film; and
a second insulating layer provided between the first insulating layer and the electrode film and being different in composition from the first insulating layer, wherein
the electrode film includes:
a conductive body part; and
a conductive layer covering part of a surface of the conductive body part, and
the conductive layer is placed between the conductive body part and the semiconductor member, not placed between the conductive body part and the first insulating member, also not placed between the conductive body part and the insulating plates, and
the second insulating layer is placed between the conductive body part and the semiconductor member, not placed between the conductive body part and the insulating plate, and also not placed between the conductive body part and the first insulating member; and
wherein a portion of the electrode film placed in the end part is thicker than a portion of the electrode film placed in the central part in the second direction of the stacked body.

2. The semiconductor memory device according to claim 1, further comprising:
conductive plates provided on both the third direction sides of the stacked body and extending in the second direction, wherein
the insulating plates are placed between the conductive plates and the stacked body.

3. The semiconductor memory device according to claim 1, wherein a portion of the insulating films placed in the end part is thinner than a portion of the insulating films placed in the central part.

4. The semiconductor memory device according to claim 1, further comprising:
a second insulating member provided in an upper part of the stacked body and extending in the second direction, wherein the conductive layer is placed between the conductive body part and the second insulating member.

5. The semiconductor memory device according to claim 1, wherein the first insulating member is placed in central part in the third direction of the end part.

6. The semiconductor memory device according to claim 1, wherein the first insulating member is placed intermittently along the second direction.

7. The semiconductor memory device according to claim 1, wherein the first insulating member is shaped like a column with a longitudinal direction in the first direction.

8. The semiconductor memory device according to claim 1, wherein the first insulating member extends in the second direction.

9. The semiconductor memory device according to claim 1, wherein the first insulating member penetrates through the stacked body in the first direction.

10. The semiconductor memory device according to claim 1, wherein the first insulating member is placed in an upper part of the stacked body.

11. The semiconductor memory device according to claim 10, wherein the electrode film placed in the upper part of the end part of the stacked body is thicker than the electrode film placed in a lower part of the end part.

12. The semiconductor memory device according to claim 1, further comprising:
   a conductive member provided in the first insulating member.

* * * * *